United States Patent
Tsubota

(10) Patent No.: US 9,647,642 B2
(45) Date of Patent: May 9, 2017

(54) CLOCK PHASE ADJUSTMENT MECHANISM OF A RING OSCILLATOR USING A PHASE CONTROL SIGNAL

(71) Applicant: MegaChips Corporation, Osaka (JP)

(72) Inventor: Hidetoshi Tsubota, Chiba (JP)

(73) Assignee: MegaChips Corporation, Osaka (JP)

( * ) Notice: Subject to any disclaimer, the term of this patent is extended or adjusted under 35 U.S.C. 154(b) by 0 days.

(21) Appl. No.: 14/809,920

(22) Filed: Jul. 27, 2015

(65) Prior Publication Data

US 2016/0028379 A1 Jan. 28, 2016

(30) Foreign Application Priority Data

Jul. 28, 2014 (JP) ................ 2014-152764

(51) Int. Cl.
| | |
|---|---|
| H03K 3/012 | (2006.01) |
| H03K 3/03 | (2006.01) |
| H03K 3/356 | (2006.01) |
| H03K 5/04 | (2006.01) |
| H03K 5/131 | (2014.01) |
| H03K 5/14 | (2014.01) |
| H03K 5/151 | (2006.01) |

(52) U.S. Cl.
CPC .......... *H03K 3/012* (2013.01); *H03K 3/0322* (2013.01); *H03K 3/356182* (2013.01); *H03K 5/04* (2013.01); *H03K 5/131* (2013.01); *H03K 5/14* (2013.01); *H03K 5/151* (2013.01)

(58) Field of Classification Search
CPC ........ H03K 3/012; H03K 3/011; H03K 3/016; H03K 3/017; H03K 5/14; H03K 5/151; H03K 5/156; H03K 5/04; H03K 3/084; H03K 5/133

USPC .......................... 327/156, 158, 291
See application file for complete search history.

(56) References Cited

U.S. PATENT DOCUMENTS

| | | | |
|---|---|---|---|
| 6,426,662 B1 * | 7/2002 | Arcus ............... | H03K 3/0231 327/274 |
| 7,518,423 B2 | 4/2009 | Kumata | |
| 2002/0039039 A1 * | 4/2002 | Maligeorgos ........ | H03B 19/14 327/116 |
| 2008/0150597 A1 * | 6/2008 | Hu .................... | H03L 7/0805 327/158 |

FOREIGN PATENT DOCUMENTS

| | | |
|---|---|---|
| JP | 2007-228043 A | 9/2007 |
| JP | 2010-206344 A | 9/2010 |

* cited by examiner

*Primary Examiner* — John Poos
(74) *Attorney, Agent, or Firm* — Osha Liang LLP

(57) ABSTRACT

A clock generator comprises a voltage controlled oscillator including a ring oscillator which has a plurality of differential inverter circuits connected in a ring shape, and a phase controller to control an output of a differential inverter circuit which belongs to a second group, in a first state or a second state, for a predetermined time period. The differential inverter circuit which belongs to the second group is distinct from a differential inverter circuit which belongs to a first group. The differential inverter circuit which belongs to the second group, in the first state, outputs a first logic signal from a first differential output terminal and outputs a second logic signal from a second differential output terminal. Further, the differential inverter circuit which belongs to the second group, in the second state, outputs the second logic signal from the first differential output terminal and outputs the first logic signal from the second differential output terminal.

20 Claims, 19 Drawing Sheets

CLOCK PHASE ADJUSTMENT MECHANISM OF A RING OSCILLATOR USING A PHASE CONTROL SIGNAL

BACKGROUND OF THE INVENTION

Field of the Invention

The present invention relates to a clock generator, and particularly relates to a voltage controlled oscillator.

Description of the Related Art

A clock generator including a voltage controlled oscillator (VCO: Voltage Controlled Oscillator) has generally been used for generating a clock having a predetermined frequency. The voltage controlled oscillator is a circuit that controls an oscillation frequency of a clock depending on the electric potential applied externally. In a case of use in a semiconductor integrated circuit specialized in a specific function (for example, ASIC: Application Specific Integrated Circuit or ASSP: Application Specific Standard Product), a clock generator is often required to be capable of regulating or adjusting a phase of a clock. Such a semiconductor integrated circuit is needed in many fields such as information appliances and automobile electronics, and therefore, the clock generator capable of regulating the phase of the clock is mainly used in the current information society.

As a clock generator capable of regulating a phase of a clock, there is a clock generator including a ring type voltage controlled oscillator. Such a ring type voltage controlled oscillator is configured by multiple inverters connected in a ring shape. The ring type voltage controlled oscillator oscillates at a frequency based on a voltage to be given externally, and outputs clocks with different phases from one another, from the differential inverters. The clock generator including such a ring type voltage controlled oscillator selects and outputs, with a multiplexer, either of the clocks with different phases from one another that are output by the differential inverter circuits, and thereby outputs a clock having an arbitrary phase.

For example, Japanese Patent Publication No. 2010-206344 discloses a clock generator having a spread spectrum function. The clock generator disclosed in Japanese Patent Publication No. 2010-206344 includes multiphase clock generation means for generating multiphase clock signals based on a phase difference between a reference clock signal and a feedback clock signal and outputting two clock signals having adjacent phases, modulated waveform data storage means for storing modulated waveform data in which a phase step for frequency modulation changes stepwise, correction means for outputting phase correction data for correcting the phase at each phase step of the modulated waveform data, and phase interpolation means for interpolating the phase between the two clock signals based on the phase correction data and the modulated waveform data, generating an interpolated clock signal, and supplying the interpolated clock signal to the multiphase clock generation means.

Further, for example, Japanese Patent Publication No. 2007-228043 discloses a digital DLL (Delay Locked Loop) circuit. The digital DLL circuit disclosed in Japanese Patent Publication No. 2007-228043 includes a register to retain a delay target value, an oscillator, a first counter to count an external reference clock or the oscillatory output of the oscillator for determining a measurement cycle, a second counter to count the oscillatory output of the oscillator or the external reference clock in the measurement cycle determined by the first counter, a digitally controlled variable delay circuit, and a controller to control the reset, start and furthermore, as necessary, stop of the first counter and the second counter based on the count value of the first counter, to perform a digital operation for the count value of the second counter and the delay target value of the register, and to give the operation result to the variable delay circuit as a delay control value.

The above-described clock generator disclosed in Japanese Patent Publication No. 2010-206344 and the above-described clock generator included in the digital DLL disclosed in Japanese Patent Publication No. 2007-228043 both used a multiplexer for obtaining a clock having an arbitrary phase. Therefore, such conventional clock generators has a problem in that the electric power consumption of the whole chip increases because a high-speed clock is input to the multiplexer. Further, the conventional clock generators has a problem in that the controller (i.e., the multiplexer) connected at each output stage of the voltage controlled oscillator exerts an adverse influence on the oscillation frequency of the voltage controlled oscillator by its own parasitic capacitance. Furthermore, the conventional clock generators has a problem in that it is difficult to regulate the phase of the clock with a high accuracy because a separate circuit is required for regulating a further finer phase than the phase of the clock to be output by each output stage of the voltage controlled oscillator.

Hence, the present invention has an object to provide a clock generator that can regulate a phase of a clock with a low electric power consumption.

Further, the present invention has an object to provide a clock generator that can regulate a phase of a clock with a high accuracy.

Furthermore, the present invention has an object to provide a clock generator that can reduce influence of a controller on the oscillation frequency of the clock.

SUMMARY OF THE INVENTION

The present invention to solve the above problems may be configured to include the following technical features and invention-specifying matters.

According to an aspect, the present invention may be a clock generator. The clock generator may comprise a voltage controlled oscillator including a ring oscillator that has a plurality of differential inverter circuits connected in a ring shape, and a phase controller configured to control an output of at least one differential inverter circuit which belongs to a second group other than at least one differential inverter circuit which belongs to a first group in the plurality of differential inverter circuits, in a first state or a second state, for a predetermined time period. The at least one differential inverter circuit which belong to the second group, in the first state, may output a first logic signal from a first differential output terminal and output a second logic signal from a second differential output terminal. Further, the at least one differential inverter circuit which belongs to the second group, in the second state, may output the second logic signal from the first differential output terminal and output the first logic signal from the second differential output terminal.

The phase controller may control an output of the differential inverter circuit which belongs to the first group, to a third state, for the predetermined time period. Further, the differential inverter circuit which belongs to the first group, in the third state, may perform logical negation for an output of a differential inverter circuit connected at the previous stage, and output a result of the logical negation to a differential inverter circuit at the next stage.

Moreover, each of the plurality of differential inverter circuits may comprise a first inverter circuit configured to perform logical negation for one of differential clocks to be input to a first differential input terminal and to output a result of the logical negation from the second differential output terminal, and a second inverter circuit configured to perform logical negation for the other of the differential clocks to be input to a second differential input terminal and to output the result of the logical negation from the first differential output terminal.

In addition, each of the plurality of differential inverter circuits may further comprise a first current path to be connected between the first differential output terminal and a first power line, and a second current path to be connected between the second differential output terminal and the first power line. The first current path and the second current path may be electrically connected, respectively, when the corresponding differential output terminal outputs the first logic signal.

In addition, each of the plurality of differential inverter circuits may further comprise a first current path to be connected between the first differential output terminal and a second power line, and a second current path to be connected between the second differential output terminal and the second power line. The first current path and the second current path may be electrically connected, respectively, when the corresponding differential output terminal outputs the second logic signal.

Further, the phase controller may control the output of the differential inverter circuit which belongs to the second group, in the first state or the second state, for the predetermined time period, in a predetermined cycle proportional to a cycle of a first differential clock that is output by the voltage controlled oscillator.

Further, the phase controller may output a coarse phase control signal and a fine phase control signal to the voltage controlled oscillator. The coarse phase control signal may have information about a correspondence relationship of each of the plurality of differential inverter circuits to the first state and the second state. The fine phase control signal may have information about the predetermined time period and having a pulse waveform, and at a rising or a falling of the pulse waveform of the fine phase control signal. The voltage controlled oscillator may determine each output of the plurality of differential inverter circuits as the first state or the second state in accordance with the correspondence relationship, for the predetermined time period corresponding to a pulse width of the fine phase control signal.

Moreover, the phase controller may comprise a phase setter configured to determine a fine phase setting based on a regulation angle that is requested externally, a differential delay controller configured to provide a first delay time in accordance with the fine phase setting to a second differential clock and to output the second differential clock as a third differential clock, a delay circuit configured to provide a second delay time corresponding to a pulse width to the third differential clock and to output the third differential clock as a fourth differential clock, and a logic circuit configured to generate a fine phase control signal in accordance with the third differential clock and the fourth differential clock and to output the fine phase control signal to the voltage controlled oscillator. The fine phase setting may be relevant to a phase difference of a differential clock that is output by each of the plurality of differential inverter circuits.

The regulation angle may be a regulation angle for a phase of a first differential clock that is output by the voltage controlled oscillator.

Furthermore, the phase setter may determine a coarse phase setting based on the regulation angle. The coarse phase setting may indicate a greater phase difference than the phase difference which the fine phase setting indicates. The phase controller, synchronously with the fine phase control signal, may output the coarse phase setting to the voltage controlled oscillator, as the coarse phase control signal.

Further, the logic circuit may perform exclusive disjunction for the third differential clock and the fourth differential clock, and output a result of the exclusive disjunction to the voltage controlled oscillator, as the fine phase control signal.

Further, the phase setter may determine the at least one differential inverter circuit as the first group which corresponds to the regulation angle from among the plurality of differential inverter circuits, determine the at least one differential inverter circuit as the second group other than the at least one differential inverter circuit which belongs to the first group from among the plurality of differential inverter circuits. The phase setter may determine the output of the at least one differential inverter circuit which may belong to the second group, as the first state or the second state, and set the determined state of the outputs of the plurality of differential inverter circuits as the coarse phase setting.

Moreover, the phase setter may set a predetermined count value to an initial value. The phase setter may judge whether the regulation angle is greater than or equal to 180°, and increments the predetermined count value in a case of judging that the regulation angle is greater than or equal to 180°. Further, the phase setter may judge whether, in the ring oscillator, a specific differential inverter circuit which belongs to the second group is at a subsequent stage relative to the differential inverter circuit which belongs to the first group, and increment the predetermined count value in a case of judging that, in the ring oscillator, the specific differential inverter circuit is at a subsequent stage relative to the differential inverter circuit which belongs to the first group. Further, the phase setter may judge whether, in the ring oscillator, the specific differential inverter circuit is at an odd-numbered stage counting from the differential inverter circuit which belongs to the first group, and increment the predetermined count value in a case of judging that, in the ring oscillator, the single differential inverter circuit is at an odd-numbered stage counting from the differential inverter circuit corresponding to the first group. Further, the phase setter may judge whether the predetermined count value is an odd number, determine an output of the single differential inverter circuit as the first state in a case of judging that the predetermined count value is an odd number, and determine the output of the single differential inverter circuit as the second state in a case of judging that the predetermined count value is not an odd number.

In addition, the clock generator may further comprise a frequency controller corresponding to operation of the voltage controlled oscillator so as to an oscillation frequency of the ring oscillator.

Moreover, according to another aspect, the present invention may be a regulation method for a phase of a differential clock that is output by a voltage controlled oscillator including a ring oscillator which has a plurality of differential inverter circuits operably connected in a ring shape. The method may comprise controlling an output of at least one differential inverter circuit which belongs to a second group other than at least one differential inverter circuit which belongs to a first group in the plurality of differential inverter circuits, in a first state or a second state, for a predetermined time period. The at least one differential inverter circuit which belongs to the second group, in the first state, may output a first logic signal from a first differential output terminal and output a second logic signal from a second differential output terminal. Further, the at least one differential inverter circuit which belongs to the second group, in the second state, may output the second logic signal from the first differential output terminal and output the first logic signal from the second differential output terminal.

According to the present invention, the clock generator can regulate the phase of the clock with a low electric power consumption.

Further, according to the present invention, the clock generator can regulate the phase of the clock with a high accuracy.

Further, according to the present invention, the clock generator can regulate the phase of the differential clock, while reducing the influence of the controller on the oscillation frequency of the clock.

Other technical features, objects, operation effects and advantages of the present invention will be revealed by the following embodiments, which will be described with reference to the accompanying drawings.

DETAILED DESCRIPTION OF THE PREFERRED EMBODIMENTS

Embodiments of the present invention will be described with reference to the drawings.

In this disclosure, as for a state of a signal, a positive logic is defined as "1", and a negative logic is defined as "0". Further, a transition from the positive logic to the negative logic is defined as "falling", and a transition from the negative logic to the positive logic is defined as "rising". Further, a state of a differential signal (i.e., "0" and "1", or "rising" and "falling") will be explained by a state of the positive signal of the differential signal, and thus description of the negative signal of the differential signal will be omitted.

Figure 1:
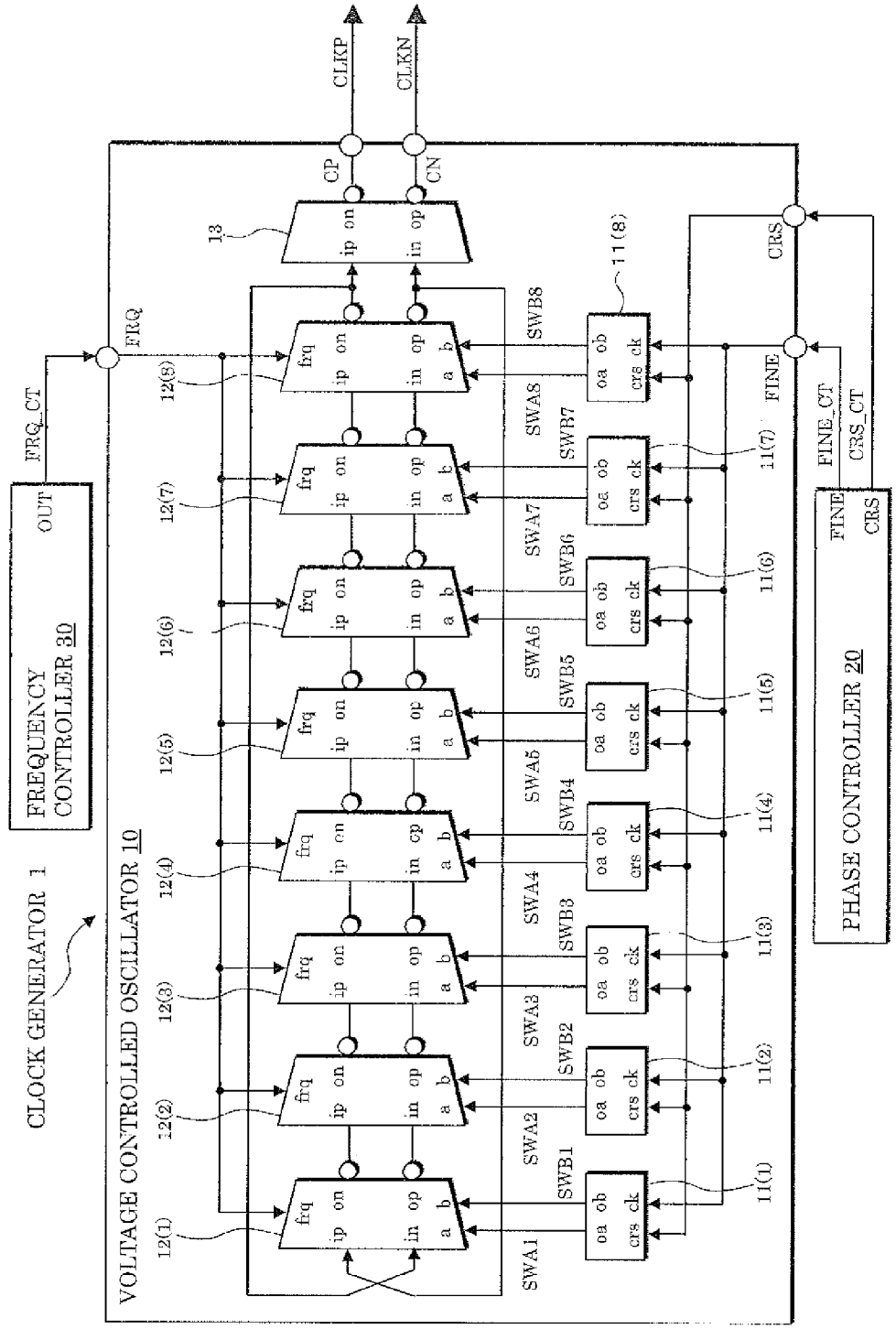
FIG. 1 is a block diagram showing an example of a schematic configuration of a clock generator according to an embodiment of the present invention.

FIG. 1 is a block diagram showing an example of a schematic configuration of a clock generator according to an embodiment of the present invention. As shown in FIG. 1, a clock generator 1 according to the embodiment may be implemented by a configuration of including, for example, a voltage controlled oscillator 10, a phase controller 20, and a frequency controller 30.

The voltage controlled oscillator 10 may be a ring oscillator that has a plurality of differential inverter circuits 12 connected in a ring shape. The voltage controlled oscillator 10 may be configured to include, for example, a plurality of differential inverter controllers 11, the plurality of differential inverter circuits 12 corresponding to the differential inverter controllers 11, respectively, and a differential amplifier circuit 13. The voltage controlled oscillator 10 may generate differential clocks CLKP and CLKN having phases to be determined by the phase controller 20 and frequencies to be determined by the frequency controller 30, and then output the differential clocks to the exterior.

Specifically, the voltage controlled oscillator 10 may generate the differential clocks CLKP and CLKN having phases to be determined based on a fine phase control signal FINE_CT and a coarse phase control signal CRS_CT that are input from the phase controller 20 to a fine terminal FINE and a coarse terminal CRS, respectively, and frequencies to be determined based on a frequency control signal. FRQ_CT that is input from the frequency controller 30 to a frequency terminal FRQ. The voltage controlled oscillator may then output the differential clocks CLKP and CLKN from clock terminals CP and CN to the exterior, respectively.

In this example, eight differential inverter controllers 11 and differential inverter circuits 12 (i.e., differential inverter controllers 11(1) to 11(8) and differential inverter circuits 12(1) to 12(8)) are provided in the voltage controlled oscillator 10. However, without being limited to this, an arbitrary number of differential inverter controllers 11 and differential inverter circuits 12 may be provided in the voltage controlled oscillator 10.

At the timing based on the fine phase control signal FINE_CT output from the phase controller 20, the differential inverter controller 11 may generate switch signals SWA and SWB in accordance with the control content for the corresponding differential inverter circuit 12 in a state of the coarse phase control signal CRS_CT output from the phase controller 20, and may output the signals to the corresponding differential inverter circuit 12.

Specifically, the differential inverter controller 11 may check a state of the coarse phase control signal CRS_CT output from the phase controller 20. In a case where the differential inverter controller 11 judges that control content for the corresponding differential inverter circuit 12 in a state of the coarse phase control signal CRS_CT indicates a "non-control" for example, the differential inverter controller 11 may set, for example, "1", as both of the states of the switch signals SWA and SWB, and then output the signals from output terminals oa and ob to input terminals a and b of the corresponding differential inverter circuit 12.

Further, in a case where the differential inverter controller 11 judges that the control content for the corresponding differential inverter circuit 12 in the state of the coarse phase control signal CRS_CT indicates a "positive logic control" for example, the differential inverter controller 11 may set, for example, "1" and "0", as the states of the switch signals SWA and SWB, respectively, and then output the signals from the output terminals oa and ob to the input terminals a and b of the corresponding differential inverter circuit 12, respectively.

Further, in a case where the differential inverter controller 11 judges that the control content for the corresponding differential inverter circuit 12 in the state of the coarse phase control signal CRS_CT indicates a "negative logic control" for example, the differential inverter controller 11 may set, for example, "0" and "1", as the states of the switch signals SWA and SWB, respectively, and then output the signals from the output terminals oa and ob to the input terminals a and b of the corresponding differential inverter circuit 12, respectively.

The differential inverter circuit 12 may be, for example, an operational amplifier. A plurality of such circuits may be connected in a ring shape, and thereby a ring oscillator may be configured. The ring oscillator may generate differential clocks having a frequency based on the frequency control signal FRQ_CT output from the frequency controller 30 and phases based on the switch signals SWA and SWB output from the differential inverter controller 11 to the corresponding differential inverter circuits 12 respectively, and then output the clocks to the differential amplifier circuit 13.

The differential inverter circuit 12(1) at the foremost stage in the ring oscillator may determine states of differential output terminals op and on, based on differential clocks input from a positive differential output terminal op and a negative differential output terminal on (hereinafter, referred to as merely "differential output terminals") of the differential inverter circuit 12(8) at the previous stage (i.e., the last stage) to a positive differential input terminal ip and a negative differential input terminal in (hereinafter, referred to as merely "differential input terminals") respectively and switch signals SWA1 and SWB1 input from the differential inverter controller 11(1) to the input terminals a and b respectively, and then output the states to differential input terminals in and ip of the differential inverter circuit 12(2) at the next stage, respectively.

The differential inverter circuit 12(8) at the last stage in the ring oscillator may determine the states of differential output terminals op and on, based on differential clocks input from differential output terminals on and op of the differential inverter circuit 12(7) at the previous stage to differential input terminals ip and in respectively and switch signals SWA8 and SWB8 input from the differential inverter controller 11(8) to the input terminals a and b respectively. The differential inverter circuit 12(8) may output the state of the differential output terminal on to a differential input terminal ip of the differential amplifier circuit 13 and the differential input terminal in of the differential inverter circuit 12(1) at the next stage (i.e., the foremost stage), and then output the state of the differential output terminal op to a differential input terminal in of the differential amplifier circuit 13 and the differential input terminal ip of the differential inverter circuit 12(1) at the foremost stage.

A differential inverter circuit 12($x$) that is from the next stage after the foremost stage to the previous stage before the last stage in the ring oscillator may determine the states of differential output terminals op and on, based on differential clocks output from differential output terminals op and on of a differential inverter circuit 12($x$−1) at the previous stage to differential input terminals in and ip respectively and switch signals SWAx and SWBx output from a differential inverter controller 11($x$) to the input terminals a and b respectively, and then output the states to differential input terminals in and ip of a differential inverter circuit 12($x$+1) at the next stage, respectively. Details of operation of the differential inverter circuit 12 will be described with reference to the following Table 1. Further, details of a configuration of the differential inverter circuit 12 will be described with reference to FIG. 2 and FIG. 3.

TABLE 1

| SWA | SWB | STATES OF DIFFERENTIAL OUTPUT TERMINALS op AND on |
|---|---|---|
| 0 | 0 | PROHIBITED |
| 0 | 1 | STATE OF op: 1 STATE OF on: 0 |
| 1 | 0 | STATE OF op: 0 STATE OF on: 1 |
| 1 | 1 | STATE OF op: DEPENDENT ON STATE OF In STATE OF on: DEPENDENT ON STATE OF Ip |

Table 1 shows a relationship between the states of the switch signals SWA and SWB to be output by the differential inverter controller 11 and the states of the differential output terminals op and on of the differential inverter circuit 12. As shown in the table, the differential inverter circuit 12 may determine the states of the differential output terminals op and on, based on the states of the switch signals SWA and SWB.

In a case where both of the states of the switch signals SWA and SWB are "0", the differential inverter circuit 12 becomes in a prohibited state. In the prohibited state, the differential inverter circuit 12 cannot operate normally, and therefore, as described above, the differential inverter controller 11 may determine the states of the switch signals SWA and SWB such that the differential inverter circuit 12 does not become in the prohibited state during the operation.

In a case where the states of the switch signals SWA and SWB are "0" and "1" respectively, the differential inverter circuit 12 may determine the states of the differential output terminals op and on as "1" and "0" respectively (positive logic control state). Further, in a case where the states of the switch signals SWA and SWB are "1" and "0" respectively, the differential inverter circuit 12 may determine the states of the differential output terminals op and on as "0" and "1" respectively (negative logic control state). That is, in the case where the states of the switch signals SWA and SWB are different from each other, the differential inverter circuit 12 may determine the states of the differential output terminals op and on, without depending on the states of the differential input terminals ip and in.

In a case where both of the states of the switch signals SWA and SWB are "1", the differential inverter circuit 12 may determine the states of the differential output terminals on and op based on the states of the differential input terminals ip and in, respectively. In this case, the differential inverter circuit 12 may perform logical negation for the differential clocks output from the differential inverter circuit 12 at the previous stage to the differential input terminals ip and in, and then output the differential clocks from the differential output terminals on and op to the differential inverter circuit 12 at the next stage. In the differential inverter circuit 12, a state in which the states of the differential output terminals on and op are determined based on the states of the differential input terminals ip and in respectively is referred to as a non-control state.

The differential amplifier circuit 13 may be, for example, an operational amplifier. The differential amplifier circuit 13 may amplify the differential clocks generated by the ring oscillator at a predetermined magnification, to output them as the differential clocks CLKP and CLKN, respectively. Specifically, the differential amplifier circuit 13 may receive the differential clocks generated by the ring oscillator through the differential input terminals ip and in, may amplify the clocks at a predetermined magnification, and then output them from the differential output terminals on and op to the exterior, as the differential clocks CLKP and CLKN.

The phase controller 20 may control phases of the differential clocks CLKP and CLKN to be generated by the voltage controlled oscillator 10. Specifically, based on a phase setting request that is requested to the clock generator 1, the phase controller 20 may generate the coarse phase control signal CRS_CT and the fine phase control signal FINE_CT, output the signals from the coarse terminal CRS and the fine terminal FINE to the coarse terminal CRS and fine terminal FINE of the voltage controlled oscillator 10 respectively, and by the signals, control the phases of the differential clocks CLKP and CLKN to be output by the voltage controlled oscillator 10.

The frequency controller 30 may be, for example, a PLL (Phased Locked Loop) circuit. The frequency controller 30 may control the frequency of the differential clocks CLKP and CLKN to be generated and output by the voltage controlled oscillator 10. More specifically, based on an oscillation frequency which is requested to the clock generator 1, the frequency controller 30 may generate the frequency control signal FRQ_CT, output the signal to the frequency terminal FRQ of the voltage controlled oscillator 10, and by the signal, control the frequency of the differential clocks CLKP and CLKN to be generated by the voltage controlled oscillator 10.

The clock generator 1 configured as described above, since a multiplexer is not connected with the output terminals op and on of each differential inverter circuit 12 of the ring oscillator, can operate with a low electric power consumption, and furthermore, can regulate the phases of the differential clocks CLKP and CLKN while reducing the influence of a multiplexer on the oscillation frequency of the voltage controlled oscillator 10. Further, the clock generator 1 according to the embodiment may control the output of each differential inverter circuit 12, based on the fine phase control signal FINE_CT and in accordance with the coarse phase control signal CRS_CT, and thereby, can regulate the phases of the differential clocks CLKP and CLKN with a high accuracy.

Figure 2:
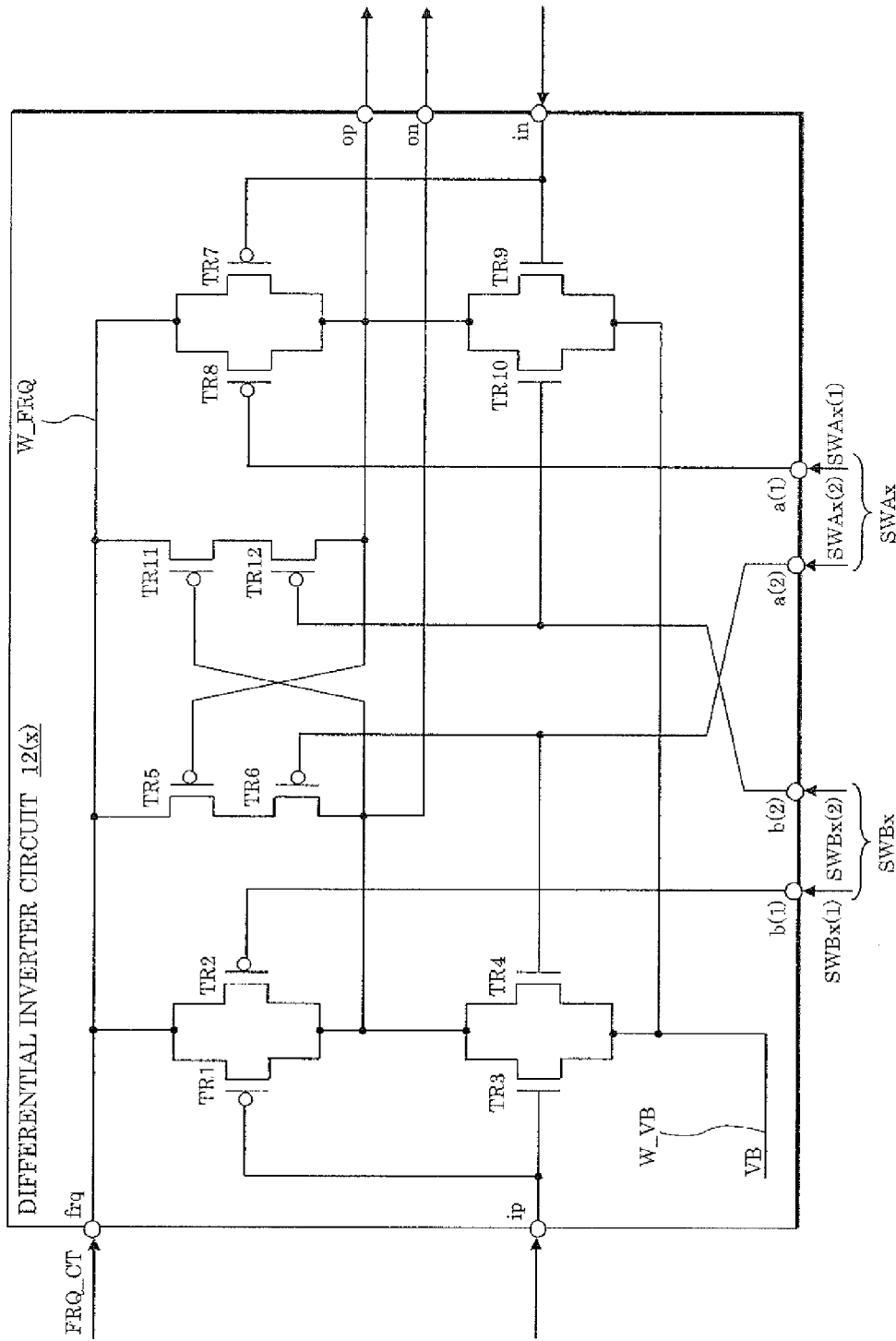
FIG. 2 is a circuit diagram showing an example of a differential inverter circuit in a clock generator according to an embodiment of the present invention.

FIG. 2 is a circuit diagram showing an example of a differential inverter circuit in a clock generator according to an embodiment of the present invention. As shown in FIG. 2, the differential inverter circuit 12(x) may be configured to include, for example, transistors TR1 to TR12. Further, a frequency control signal wire W_FRQ functions as a positive power line of the differential inverter circuit 12(x), and a bias wire W_VB functions as a negative power line of the circuit. In this disclosure, switch signals SWAx and SWBx are typically differential signals. Further, the positive (normal phase) and negative (reverse phase) signals of the switch signal SWAx are defined as switch signals SWAx(1) and SWAx(2), respectively. Further, the positive (normal phase) and negative (reverse phase) signals of the switch signal SWBx are defined as switch signals SWBx(1) and SWBx(2).

The transistor TR1 may be, for example, a P-type transistor. The transistor TR1 may control the ON/OFF thereof based on a state of one of the differential clocks output from the differential inverter circuit 12(x−1) at the previous stage, and thereby, determine the state of the differential output terminal on. Further, in the transistor TR1, the drain may be connected with the differential output terminal on, the drains of the transistors TR2 to TR4 and TR6, and the gate of the transistor TR11. Meanwhile, the source may be connected with a frequency terminal frq through the frequency control signal wire W_FRQ, and furthermore, the gate may be connected with the differential input terminal ip and the gate of the transistor TR3.

The transistor TR2 may be, for example a P-type transistor. The transistor TR2 may control the ON/OFF thereof based on a state of the switch signal SWBx(1) output from the differential inverter controller 11(x), and thereby, determine the state of the differential output terminal on. Further, in the transistor TR2, the drain may be connected with the differential output terminal on, the drains of the transistors TR1, TR3, TR4 and TR6, and the gate of the transistor TR11. Meanwhile, the source may be connected with the frequency terminal frq through the frequency control signal wire W_FRQ, and furthermore, the gate may be connected with an input terminal b(1).

The transistor TR3 may be, for example an N-type transistor. The transistor TR3 may control the ON/OFF thereof based on a state of one of the differential clocks output from the differential inverter circuit 12(x−1) at the previous stage, and thereby, determine the state of the differential output terminal on. Further, in the transistor TR3, the drain may be connected with the differential output terminal on, the drains of the transistors TR1, TR2, TR4 and TR6, and the gate of the transistor TR11. Meanwhile, the source may be connected with the bias wire W_VB, and furthermore, the gate may be connected with the differential input terminal ip and the gate of the transistor TR1.

The transistor TR4 may be, for example an N-type transistor. The transistor TR4 may control the ON/OFF thereof based on a state of the switch signal SWAx(2) output from the differential inverter controller 11(x), and thereby, determine the state of the differential output terminal on. Further, in the transistor TR4, the drain may be connected with the differential output terminal on, the drains of the transistors TR1 to TR3 and TR6, and the gate of the transistor TR11. Meanwhile, the source may be connected with the bias wire W_VB, and furthermore, the gate may be connected with an input terminal a(2) and the gate of the transistor TR6.

The transistor TR5 may be, for example a P-type transistor. The transistor TR5 may control the ON/OFF thereof based on an electric potential of the differential output terminal op, and thereby, determine the electric potential of the differential output terminal on. Further, in the transistor TR5, the drain may be connected with the source of the transistor TR6. Meanwhile, the source may be connected with the frequency terminal frq through the frequency control signal wire W_FRQ, and furthermore, the gate may be connected with the differential output terminal op and the drains of the transistors TR7 to TR10 and TR12.

The transistor TR6 may be, for example a P-type transistor. The transistor TR6 may control the ON/OFF thereof based on an electric potential of the switch signal SWAx(2) output from the differential inverter controller 11(x), and thereby, determine the state of the differential output terminal on. Further, in the transistor TR6, the drain may be connected with the drains of the transistors TR1 to TR4, the gate of the transistor TR11, and the differential output terminal on. Meanwhile, the source may be connected with the drain of the transistor TR5, and furthermore, the gate may be connected with the input terminal a(2) and the gate of the transistor TR4.

The transistor TR7 may be, for example a P-type transistor. The transistor TR7 may control the ON/OFF thereof based on a state of the other of the differential clocks output from the differential inverter circuit 12(x−1) at the previous stage, and thereby, determine the state of the differential output terminal op. Further, in the transistor TR7, the drain may be connected with the differential output terminal op, the drains of the transistors TR8 to TR10 and TR12, and the gate of the transistor TR5. Meanwhile, the source may be connected with the frequency terminal frq through the frequency control signal wire W_FRQ, and furthermore, the gate may be connected with the differential input terminal in and the gate of the transistor TR9.

The transistor TR8 may be, for example a P-type transistor. The transistor TR8 may control the ON/OFF thereof based on a state of the switch signal SWAx(1) output from the differential inverter controller 11(x), and thereby, determine the state of the differential output terminal op. Further, in the transistor TR8, the drain may be connected with the differential output terminal op, the drains of the transistors TR7, TR9, TR10 and TR12, and the gate of the transistor TR5. Meanwhile, the source may be connected with the frequency terminal frq through the frequency control signal wire W_FRQ, and furthermore, the gate may be connected with an input terminal a(1).

The transistor TR9 may, for example be an N-type transistor. The transistor TR9 may control the ON/OFF thereof based on a state of the other of the differential clocks output from the differential inverter circuit 12(x−1) at the previous stage, and thereby, determine the state of the differential output terminal op. Further, in the transistor TR9, the drain may be connected with the differential output terminal op, the drains of the transistors TR7, TR8, TR10 and TR12, and the gate of the transistor TR5. Meanwhile, the source may be connected with the bias wire W_VB, and furthermore, the gate may be connected with the differential input terminal in and the gate of the transistor TR7.

The transistor TR10 may be, for example an N-type transistor. The transistor TR10 may control the ON/OFF thereof based on a state of the switch signal SWBx(2) output from the differential inverter controller 11(x), and thereby, determine the state of the differential output terminal op. Further, in the transistor TR10, the drain may be connected with the differential output terminal op, the drains of the transistors TR7 to TR9 and TR12, and the gate of the transistor TR5. Meanwhile, the source may be connected with the bias wire W_VB, and furthermore, the gate may be connected with an input terminal b(2) and the gate of the transistor TR12.

The transistor TR12 may be, for example a P-type transistor. The transistor TR11 may control the ON/OFF thereof based on a state of the differential output terminal on, and thereby, determine the state of the differential output terminal op. Further, in the transistor TR11, the drain may be connected with the source of the transistor TR12. Meanwhile, the source may be connected with the frequency terminal frq through the frequency control signal wire W_FRQ, and furthermore, the gate may be connected with the differential output terminal on and the drains of the transistors TR1 to TR4 and TR6.

The transistor TR12 may be, for example a P-type transistor. The transistor TR12 may control the ON/OFF thereof based on a state of the switch signal SWBx(2) output from the differential inverter controller 11(x), and thereby, determine the state of the differential output terminal op. Further, in the transistor TR12, the drain may be connected with the drains of the transistors TR7 to TR10, the gate of the transistor TR5, and the differential output terminal op. Meanwhile, the source may be connected with the drain of the transistor TR11, and furthermore, the gate may be connected with the input terminal b(2) and the gate of the transistor TR10.

Next, the behavior of the differential inverter circuit 12(x) will be described.

[The Case where Both of the States of the Switch Signals SWAx and SWBx are "1"]

First, assume that both of the states of the switch signals SWAx and SWBx output from the differential inverter controller 11(x) are "1". In this case, the states of the gates of the transistors TR2 and TR8 become "1" similarly to the states of the switch signals SWAx(1) and SWBx(1) output from the differential inverter controller 11(x), and therefore, the transistors TR2 and TR8 are turned OFF.

Further, the states of the gates of the transistors TR4 and TR10 become "0" similarly to the state of the switch signals SWAx(2) and SWBx(2) output from the differential inverter controller 11(x), and therefore, the transistors TR4 and TR10 are turned OFF. The states of the gates of the transistors TR6 and TR12 become "0" similarly to the states of the transistors TR4 and TR10, and therefore, the transistors TR6 and TR12 are turned ON. Accordingly, the states of the differential output terminals op and on are determined based on the states of the differential input terminals in and ip, respectively (non-control state).

In a case where the differential clocks having states of "1" and "0" are input to the differential input terminals ip and in respectively, the state of the differential output terminal on becomes "0" by an inverter circuit constituted by the transistors TR1 and TR3, whereas the state of the differential output terminal op becomes "1" by an inverter circuit constituted by the transistors TR7 and TR9. The transistor TR11, since the gate is connected with the differential output terminal on, is turned ON based on the state "0" of the differential output terminal on. As described above, the transistor TR12 is ON, and therefore, the transistors TR11 and TR12 form a further current path that leads from the frequency terminal frq therethrough to the differential output terminal op. Further, the transistor TR5, since the gate is connected with the differential output terminal op, is turned OFF based on the state "1" of the differential output terminal op.

On the other hand, in a case where the differential clocks having states of "0" and "1" are input to the differential input terminals ip and in respectively, the state of the differential output terminal on becomes "1" by an inverter circuit constituted by the transistors TR1 and TR3, whereas the state of the differential output terminal op becomes "0" by an inverter circuit constituted by the transistors TR7 and TR9. The transistor TR5, since the gate is connected with the differential output terminal op, is turned ON based on the state "0" of the differential output terminal op. As described above, the transistor TR6 is ON, and therefore, the transistors TR5 and TR6 form a further current path that leads from the frequency terminal frq therethrough to the differential output terminal on. Further, the transistor TR11, since gate is connected with the differential output terminal on, is turned OFF based on the state "1" of the differential output terminal on.

By way of this, in a case where the states of the differential output terminals op and on are different states from each other, the current driving capability of the differential inverter circuit 12(x) may be maximized, and therefore, the differential inverter circuit 12(x) may control the states of the differential output terminals op and on such that the differential clocks have different states from each other.

[The Case where the States of the Switch Signals SWAx and SWBx are "1" and "0"]

Assume that the states of the switch signals SWAx and SWBx output from the differential inverter controller 11(x) are "1" and "0", respectively. In this case, the state of the gate of the transistor TR2 becomes "0" similarly to the state of the switch signal SWBx(1) output from the differential inverter controller 11(x), and therefore, the transistor TR2 is turned ON. The state of the gate of the transistor TR8 becomes "1" similarly to the state of the switch signal SWAx(1) output from the differential inverter controller 11(x), and therefore, the transistor TR8 is turned OFF.

Further, the states of the gates of the transistors TR4 and TR6 become "0" similarly to the state of the switch signal SWAx(2) output from the differential inverter controller 11(x), and therefore, the transistors TR4 and TR6 are turned OFF and ON, respectively. The states of the gates of transistors TR10 and TR12 become "1" similarly to the state of the switch signal SWBx(2) output from the differential inverter controller 11(x), and therefore, the transistors TR10 and TR12 are turned ON and OFF, respectively.

The transistors TR2, TR4, TR8 and TR10 are ON, OFF, OFF and ON, respectively. Therefore, the state of the differential output terminal on becomes "1" by the short circuit with the frequency terminal frq through the transistor TR2, whereas the state of the differential output terminal op becomes "0" by the short circuit with the bias wire W_VB through the transistor TR10 (positive logic control state).

[The Case where the States of the Switch Signals SWAx and SWBx are "0" and "1"]

Assume that the states of the switch signals SWAx and SWBx output from the differential inverter controller 11(x) are "0" and "1", respectively. In this case, the state of the gate of the transistor TR2 becomes "1" similarly to the state of the switch signal SWBx(1) output from the differential inverter controller 11(x), and therefore, the transistor TR2 is turned OFF. The state of the gate of the transistor TR8 becomes "0" similarly to the state of the switch signal SWAx(1) output from the differential inverter controller 11(x), and therefore, the transistor TR8 is turned ON.

Further, the states of the gates of the transistors TR4 and TR6 become "1" similarly to the state of the switch signal SWAx(2) output from the differential inverter controller 11(x), and therefore, the transistors TR4 and TR6 are turned ON and OFF, respectively. The states of the gates of the transistors TR10 and TR12 become "0" similarly to the state of the switch signal SWBx(2) output from the differential inverter controller 11(x), and therefore, the transistors TR10 and TR12 are turned OFF and ON, respectively.

The transistors TR2, TR4, TR8 and TR10 are OFF, ON, ON and OFF, respectively. Therefore, the state of the differential output terminal on becomes "0" by the short circuit with the bias wire W_VB through the transistor TR4, whereas the state of the differential output terminal op becomes "1" by the short circuit with the frequency terminal frq through the transistor TR5 (negative logic control state).

Figure 3:
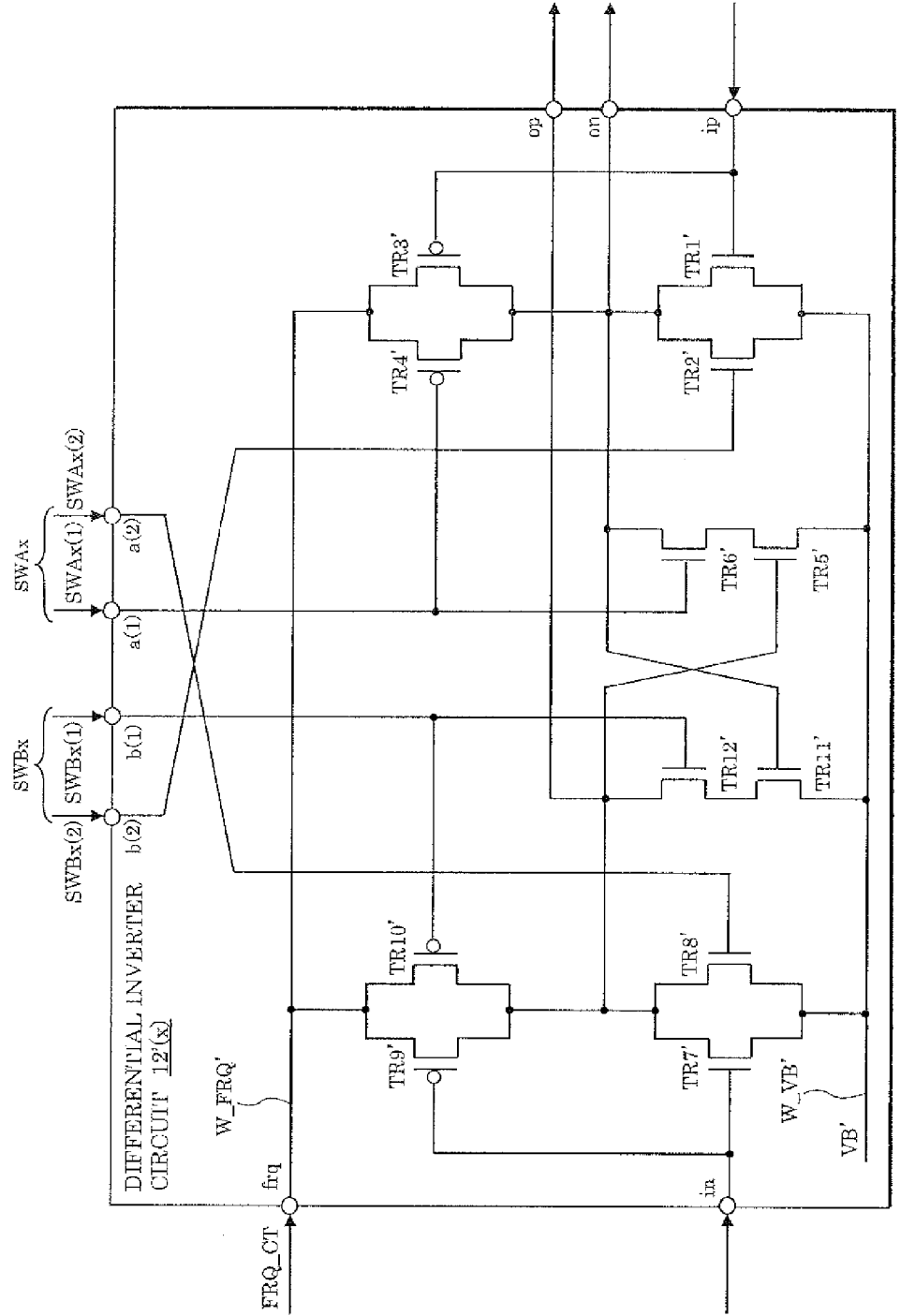
FIG. 3 is a circuit diagram showing another example of a differential inverter circuit in a clock generator according to an embodiment of the present invention.

FIG. 3 is a circuit diagram showing another example of a differential inverter circuit in a clock generator according to an embodiment of the present invention. As shown in FIG. 3, a differential inverter circuit 12'(x) may be configured to include, for example, transistors TR1' to TR12'. Further, in FIG. 3, a frequency control signal wire W_FRQ' functions as a positive power line of the differential inverter circuit 12'(x), and a bias wire W_VB' functions as a negative power line of the circuit.

The transistor TR1' may be an N-type transistor, for example. The transistor TR1' may control the ON/OFF thereof based on a state of one of the differential clocks output from the differential inverter circuit 12'(x−1) at the previous stage, and thereby, determine the state of the differential output terminal on. Further, in the transistor TR1', the drain may be connected with the differential output terminal on, the drains of the transistors TR2' to TR4' and TR6', and the gate of the transistor TR11'. Meanwhile, the source may be connected with the bias wire W_VB', and furthermore, the gate may be connected with the differential input terminal ip and the gate of the transistor TR3'.

The transistor TR2' may be an N-type transistor, for example. The transistor TR2' may control the ON/OFF thereof based on a state of the switch signal SWBx(2) output from the differential inverter controller 11(x), and thereby, determine the state of the differential output terminal on. Further, in the transistor TR2', the drain may be connected with the differential output terminal on, the drains of the transistors TR1', TR3', TR4' and TR6', and the gate of the transistor TR11'. Meanwhile, the source may be connected with the bias wire W_VB', and furthermore, the gate may be connected with the input terminal b(2).

The transistor TR3' may be a P-type transistor, for example. The transistor TR3' may control the ON/OFF thereof based on a state of one of the differential clocks output from the differential inverter circuit 12'(x−1) at the previous stage, and thereby, determine the state of the differential output terminal on. Further, in the transistor TR3', the drain may be connected with the differential output terminal on, the drains of the transistors TR1', TR2', TR4' and TR6', and the gate of the transistor TR11'. Meanwhile, the source may be connected with the frequency terminal frq through the frequency control signal wire W_FRQ', and furthermore, the gate may be connected with the differential input terminal ip and the gate of the transistor TR1'.

The transistor TR4' may be a P-type transistor, for example. The transistor TR4' may control the ON/OFF thereof based on a state of the switch signal SWAx(1) output from the differential inverter controller 11(x), and thereby, determine the state of the differential output terminal on. Further, in the transistor TR4', the drain may be connected with the differential output terminal on, the drains of the transistors TR1' to TR3' and TR6', and the gate of the transistor TR11'. Meanwhile, the source may be connected with the frequency terminal frq through the frequency control signal wire W_FRQ', and furthermore, the gate may be connected with the input terminal a(1) and the gate of the transistor TR6'.

The transistor TR5' may be an N-type transistor, for example. The transistor TR5' may control the ON/OFF thereof based on a state of the differential output terminal op, and thereby, determine the state of the differential output terminal on. Further, in the transistor TR5', the drain may be connected with the source of the transistor TR6'. Meanwhile, the source may be connected with the bias wire W_VB', and furthermore, the gate may be connected with the differential output terminal op and the drains of the transistors TR7' to TR10' and TR12'.

The transistor TR6' may be an N-type transistor, for example. The transistor TR6' may control the ON/OFF thereof based on a state of the switch signal SWAx(1) output from the differential inverter controller 11(x), and thereby, determine the state of the differential output terminal on. Further, in the transistor TR6', the drain may be connected with the drains of the transistors TR1' to TR4', the gate of the transistor TR11', and the differential output terminal on. Meanwhile, the source may be connected with the drain of the transistor TR5', and furthermore, the gate may be connected with the input terminal a(1) and the gate of the transistor TR4'.

The transistor TR7' may be an N-type transistor, for example. The transistor TR7' may control the ON/OFF thereof based on a state of the other of the differential clocks output from the differential inverter circuit 12'(x−1) at the previous stage, and thereby, determine the state of the differential output terminal op. Further, in the transistor TR7', the drain may be connected with the differential output terminal op, the drains of the transistors TR8' to TR10' and TR12', and the gate of the transistor TR5'. Meanwhile, the source may be connected with the bias wire W_VB', and furthermore, the gate may be connected with the differential input terminal in and the gate of the transistor TR9'.

The transistor TR8' may be an N-type transistor, for example. The transistor TR8' may control the ON/OFF thereof based on a state of the switch signal SWAx(2) output from the differential inverter controller 11(x), and thereby, determine the state of the differential output terminal op. Further, in the transistor TR8', the drain may be connected with the differential output terminal op, the drains of the transistors TR7', TR9', TR10' and TR12', and the gate of the transistor TR5'. Meanwhile, the source may be connected with the bias wire W_VB', and furthermore, the gate may be connected with the input terminal a(2).

The transistor TR9' may be a P-type transistor, for example. The transistor TR9' may control the ON/OFF thereof based on a state of the other of the differential clocks output from the differential inverter circuit 12'(x−1) at the previous stage, and thereby, determine the state of the differential output terminal op. Further, in the transistor TR9', the drain may be connected with the differential output terminal op, the drains of the transistors TR7', TR8', TR10' and TR12', and the gate of the transistor TR5'. Meanwhile, the source may be connected with the frequency terminal frq through the frequency control signal wire W_FRQ', and furthermore, the gate may be connected with the differential input terminal in and the gate of the transistor TR7'.

The transistor TR10' may be a P-type transistor, for example. The transistor TR10' may control the ON/OFF thereof based on a state of the switch signal SWBx(1) output from the differential inverter controller 11(x), and thereby, determine the state of the differential output terminal op. Further, in the transistor TR10', the drain may be connected with the differential output terminal op, the drains of the transistors TR7' to TR9' and TR12', and the gate of the transistor TR5'. Meanwhile, the source may be connected with the frequency terminal frq through the frequency control signal wire W_FRQ', and furthermore, the gate may be connected with the input terminal b(1) and the gate of the transistor TR12'.

The transistor TR11' may be an N-type transistor, for example. The transistor TR11' may control the ON/OFF thereof based on a state of the differential output terminal on, and thereby, determine the state of the differential output terminal op. Further, in the transistor TR11', the drain may be connected with the source of the transistor TR12'. Meanwhile, the source may be connected with the bias wire W_VB', and furthermore, the gate may be connected with the differential output terminal on and the drains of the transistors TR1' to TR4' and TR6'.

The transistor TR12' may be an N-type transistor, for example. The transistor TR12' may control the ON/OFF thereof based on a state of the switch signal SWBx(1) output from the differential inverter controller 11(x), and thereby, determine the state of the differential output terminal op. Further, in the transistor TR12', the drain may be connected with the drains of the transistors TR7' to TR10', the gate of the transistor TR5', and the differential output terminal op. Meanwhile, the source may be connected with the drain of the transistor TR11', and furthermore, the gate may be connected with the input terminal b(1) and the gate of the transistor TR10'.

Next, the behavior of the differential inverter circuit 12'(x) will be described.

[The Case where Both of the States of the Switch Signals SWAx and SWBx are "1"]

First, assume that both of the states of the switch signals SWAx and SWBx output from the differential inverter controller 11(x) are "1". In this case, the states of the gates of the transistors TR2' and TR8' become "0" similarly to the states of the switch signals SWAx(2) and SWBx(2) output from the differential inverter controller 11(x), and therefore, the transistors TR2' and TR8' are turned OFF.

Further, the states of the gates of the transistors TR4' and TR10' become "1" similarly to the states of the switch signals SWAx(1) and SWBx(1) output from the differential inverter controller 11(x), and therefore, the transistors TR4' and TR10' are turned OFF. The states of the gates of the transistors TR6' and TR12' become "1" similarly to the states of the transistors TR4' and TR10', and therefore, the transistors TR6' and TR12' are turned ON. Accordingly, the states of the differential output terminals op and on are determined based on the states of the differential input terminals in and ip, respectively (non-control state).

In a case where the differential clocks having states of "1" and "0" are input to the differential input terminals ip and in, respectively, the state of the differential output terminal on becomes "0" by an inverter circuit constituted by the transistors TR1' and TRY, whereas the state of the differential output terminal op becomes "I" by an inverter circuit constituted by the transistors TR7' and TR9'. The transistor TR5', since the gate is connected with the differential output terminal op, is turned ON based on the state "1" of the differential output terminal op. As described above, the transistor TR6' is ON, and therefore, the transistors TR5' and TR6' form a further current path that leads from the differential output terminal on through themselves to the bias wire W_VB'. Further, the transistor TR1P, since the gate is connected with the differential output terminal on, is turned OFF based on the state "0" of the differential output terminal on.

On the other hand, in a case where the differential clocks having states of "0" and "1" are input to the differential input terminals ip and in, respectively, the state of the differential output terminal on becomes "1" by an inverter circuit constituted by the transistors TR1' and TR3', whereas the state of the differential output terminal op becomes "0" by an inverter circuit constituted by the transistors TR7' and TR9'. The transistor TR5', since the gate is connected with the differential output terminal op, is turned OFF based on the state "0" of the differential output terminal op. Further, the transistor TR11', since the gate is connected with the differential output terminal on, is turned ON based on the state "1" of the differential output terminal on. As described above, the transistor TR12' is ON, and therefore, the transistors TR11' and TR12' form a further current path that leads from the differential output terminal op through themselves to the bias wire W_VB'.

By way of this, in a case where the states of the differential output terminals op and on are different states from each other, the current driving capability of the differential inverter circuit 12'(x) may be maximized, and therefore, the differential inverter circuit 12'(x) may control the states of the differential output terminals op and on such that the differential clocks have different states from each other.

[The Case where the States of the Switch Signals SWAx and SWBx are "1" and "0"]

Assume that the states of the switch signals SWAx and SWBx output from the differential inverter controller 11(x) are "1" and "0", respectively. In this case, the state of the gate of the transistor TR2' becomes "1" similarly to the state of the switch signal SWBx(2) output from the differential inverter controller 11(x), and therefore, the transistor TR2' may be turned ON. The state of the gate of the transistor TR8' becomes "0" similarly to the state of the switch signal SWAx(2) output from the differential inverter controller 11(x), and therefore, the transistor TR8' may be turned OFF.

Further, the states of the gates of the transistors TR4' and TR6' become "1" similarly to the state of the switch signal SWAx(1) output from the differential inverter controller 11(x), and therefore, the transistors TR4' and TR6' are turned OFF and ON, respectively. The states of the gates of transistors TR10' and TR12' become "0" similarly to the state of the switch signal SWBx(1) output from the differential inverter controller 11(x), and therefore, the transistors TR10' and TR12' are turned ON and OFF, respectively.

The transistors TR2', TR4', TR8' and TR10' are ON, OFF, OFF and ON, respectively. Therefore, the state of the differential output terminal on becomes "0" by the short circuit with the bias wire W_VB' through the transistor TR2', whereas the state of the differential output terminal op becomes "1" by the short circuit with the frequency terminal frq through the transistor TR10' (positive logic control state).

[The Case where the States of the Switch Signals SWAx and SWBx are "0" and "1"]

Assume that the states of the switch signals SWAx and SWBx output from the differential inverter controller 11(x) are "0" and "1", respectively. In this case, the state of the gate of the transistor TR2' becomes "0" similarly to the state of the switch signal SWBx(2) output from the differential inverter controller 11(x), and therefore, the transistor TR2' may be turned OFF. The state of the gate of the transistor TR8' becomes "1" similarly to the state of the switch signal SWAx(2) output from the differential inverter controller 11(x), and therefore, the transistor TR8' may be turned ON.

Further, the states of the gates of the transistors TR4' and TR6' become "0" similarly to the state of the switch signal SWAx(1) output from the differential inverter controller 11(x), and therefore; the transistors TR4' and TR6' are turned ON and OFF, respectively. The states of the gates of the transistors TR10' and TR12' become "1" similarly to the state of the switch signal SWBx(1) output from the differential inverter controller 11(x), and therefore, the transistors TR10' and TR12' are turned OFF and ON, respectively.

The transistors TR2', TR4', TR8' and TR10' are OFF, ON, ON and OFF, respectively. Therefore, the state of the differential output terminal on becomes "1" by the short circuit with the frequency terminal frq through the transistor TR4', while the state of the differential output terminal op becomes "0" by the short circuit with the bias wire W_VB' through the transistor TR8' (negative logic control state).

Figure 4:
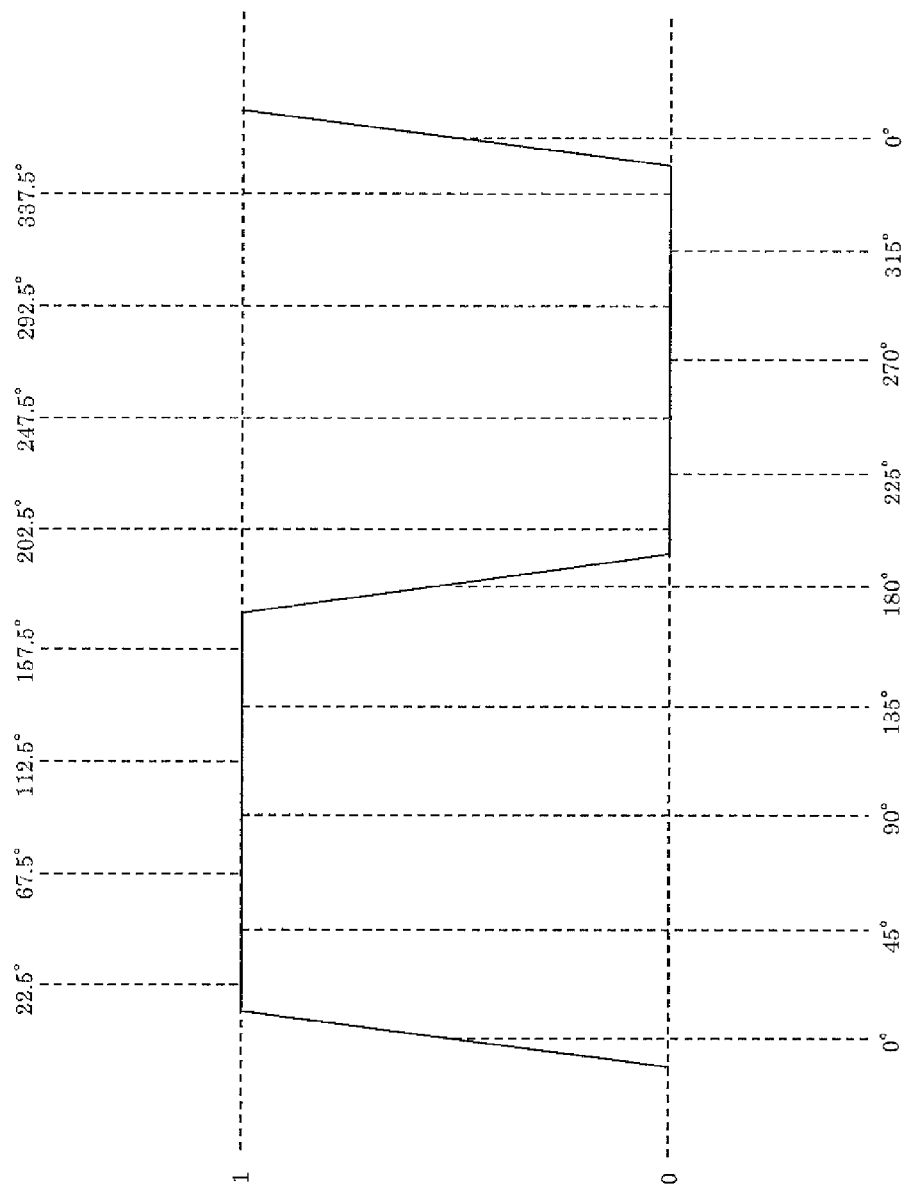
FIG. 4 is a timing chart showing each phase of a differential clock to be output by each differential inverter circuit in a clock generator according to an embodiment of the present invention.

FIG. 4 is a timing chart showing each phase of the differential clock to be output by each differential inverter circuit in a clock generator according to an embodiment of the present invention. In FIG. 4, the horizontal direction indicates a phase of a differential clock, and the vertical direction indicates a state of the differential clock.

As described above, assume that the voltage controlled oscillator 10 includes eight differential inverter circuits 12. Further, assume that the differential inverter controllers 11 all set "1" as the states of the switch signals SWA and SWB and output the signals to the differential inverter circuits 12. In this case, in the ring oscillator configured by the eight differential inverter circuits 12, the clock output from the differential output terminal op of the differential inverter circuit 12(x) propagates through the signal wires in the ring oscillator, and goes through the differential inverter circuit 12 sixteen times before returning to the differential output terminal op of the differential inverter circuit 12(x) again.

When operation of the voltage controlled oscillator 10 is stable, a phase of the differential clock that is output by each differential inverter circuit 12 in the ring oscillator may be constant, and therefore, a phase of the clock that is output from the differential output terminal op of the differential inverter circuit 12(x) and that propagates in the ring oscillator may be rotated whenever it goes through the differential inverter circuit 12. The rotation amount of the phase becomes just 360° (that is, 0°) when it has returned to the differential output terminal op of the differential inverter circuit 12(x).

Therefore, the voltage controlled oscillator 10 may generate sixteen clocks having different phases from each other, in the differential inverter circuits 12 of the ring oscillator. For example, in a case where the differential inverter circuit 12(1) outputs a clock having a phase of 0° from the differential output terminal op, the differential inverter circuits 12(2) to 12(8) may output, from the differential output terminals op, clocks having phases of 337.5°, 135°, 292.5°, 90°, 247.5°, 45° and 202.5°, respectively, and the differential inverter circuits 12(1) to 12(8) may output, from the differential output terminals on, clocks having phases of 180°, 157.5°, 315°, 112.5°, 270°, 67.5°, 225° and 22.5°, respectively.

Here, a case where the phase controller 20 controls the states of the differential output terminals op and on of the differential inverter circuit 12 will be explained. For example, a case of performing such a control that a clock having a phase of 0° is output from the differential output terminal op of the differential inverter circuit 12(2) will be considered. In this case, the phase controller 20 may generate the coarse phase control signal CRS_CT such that the states of the differential output terminals op and on of the differential inverter circuits 12(1), 12(3), 12(5) and 12(7) are "0" and "1", respectively, the states of the differential output terminals op and on of the differential inverter circuits 12(4), 12(6) and 12(8) are "1" and "0", respectively, and the states of the differential output terminals op and on of the differential inverter circuit 12(2) depend on the states of the differential input terminals ip and in, and may output the signal to the differential inverter controllers 11(1) to 11(8).

The states of the differential output terminals op and on of the differential inverter circuits 12 except the differential inverter circuit 12(2) may be controlled to the predetermined states described above. The states of the differential output terminals op and on of the differential inverter circuit 12(1), which is at the previous stage to the differential inverter circuit 12(2), are "1" and "0", respectively, and the states of the differential output terminals op and on of the differential inverter circuit 12(3), which is at the next stage, are "0" and "1", respectively. Therefore, the states of the differential output terminals op and on of the differential inverter circuit 12(2) are not determined as any of "0" and "1". The states of the differential output terminals op and on of the differential inverter circuit 12(2) are the state of the transition from "0" to "1" (i.e., rising) and the state of the transition from "1" to "0" (i.e., falling), respectively.

In this case, the phase controller 20 may alter the state of the coarse phase control signal CRS_CT such that the states of the differential output terminals op and on of each differential inverter circuit 12 depend on the states of the differential input terminals ip and in. By way of this, the voltage controlled oscillator 10 may set 0° and 180° as the phases of the clocks to be output from the differential output terminals op and on by the differential inverter circuit 12(2), respectively, and may regulate the phases of the clocks to be output by the differential inverter circuits 12(1), 12(3) to 12(8).

Thus, the clock generator 1 according to an embodiment of the present invention may control the states of the outputs of the differential inverter circuits 12 except a target differential inverter circuit 12 of the respective differential inverter circuits 12 in the ring oscillator of the voltage controlled oscillator 10, such that the state of the output of the target differential inverter circuit 12 may not be uniquely determined. By way of this, the clock generator 1 can regulate the phases of the differential clocks CLKP and CLKN to be output from the output terminals CP and CN, by controlling, to 0° and 180°, the phases of the clocks to be output by the target differential inverter circuit 12, and on the basis of the phases of the clocks, regulating the phases of the clocks to be output by the other differential inverter circuits 12. How the phase controller 20 generates the coarse phase control signal CRS_CT will be described later.

Figure 5:
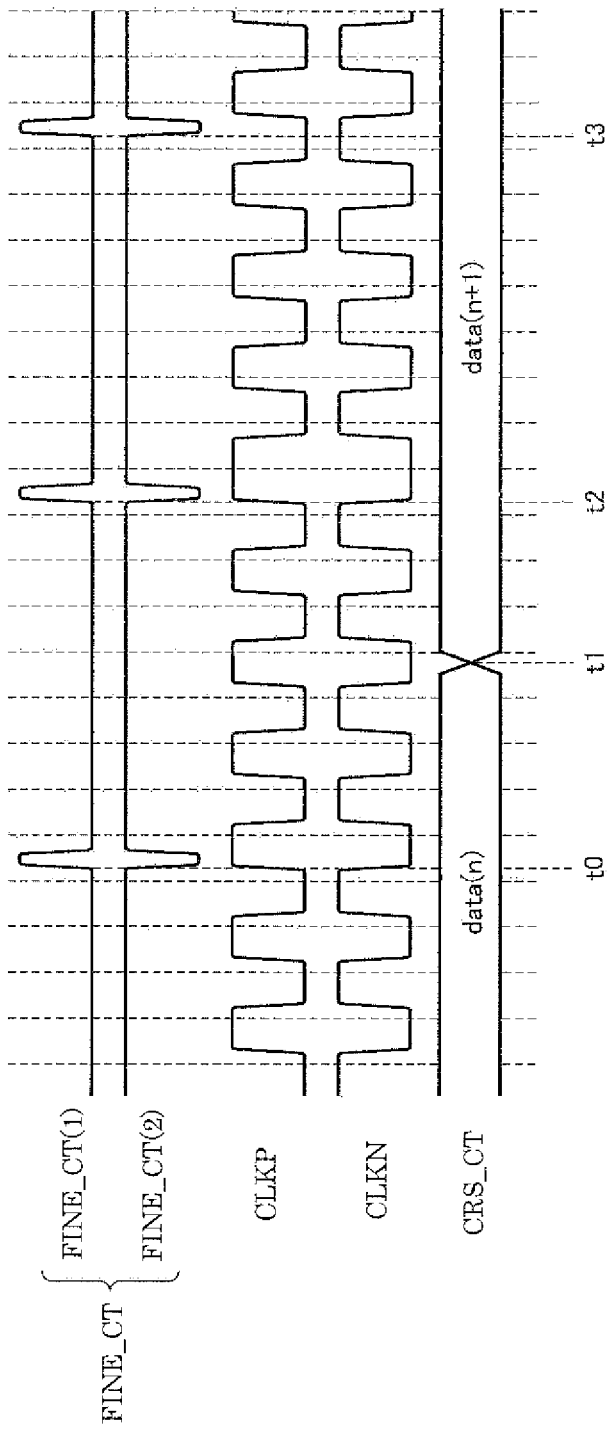
FIG. 5 is a timing chart of various signals in a clock generator according to an embodiment of the present invention.

FIG. 5 is a timing chart of various signals in a clock generator according to an embodiment of the present invention. More specifically, FIG. 5 is a timing chart of various signals in the case where the clock generator 1 rotates the phases of the differential clocks CLKP and CLKN by 90°, in the clock generator 1 according to an embodiment of the present invention.

In this disclosure, the positive and negative signals of the fine phase control signal FINE_CT are defined as fine phase control signals FINE_CT(1) and FINE_CT(2), respectively. In FIG. 5, a time when the phase controller 20 alters the state of the coarse phase control signal CRS_CT from data(n) to data(n+1) may be defined as a time t1. Further, a timing when the phase controller 20 outputs the last fine phase control signal FINE_CT with a pulse waveform before the time t1 may be defined as a time t0, a timing when the phase controller 20 outputs the first fine phase control signal FINE_CT with a pulse waveform after the time t1 may be defined as a time t2, and a timing when the phase controller 20 outputs the first fine phase control signal FINE_CT with a pulse waveform after the time t2 may be defined as a time t3.

At the time t0, the phase controller 20 outputs a fine phase control signal FINE_CT with a pulse waveform. At the time t0, the rising and falling of the differential clocks CLKP and CLKN to be output from the voltage controlled oscillator 10 are synchronous with the rising of the pulse of the fine phase control signal FINE_CT.

At the time t1, the phase controller 20 alters the state of the coarse phase control signal CRS_CT from data(n) to data(n+1), based on a control instruction, for example, from the exterior. Each differential inverter controller 11 controls the output of the differential inverter circuit 12 while the state of the fine phase control signal FINE_CT may be "1". Therefore, at the time t1, the phases of the differential clocks CLKP and CLKN to be output from the voltage controlled oscillator 10 may not change.

At the time t2, the phase controller 20 outputs a fine phase control signal FINE_CT with a pulse waveform. While the state of the fine phase control signal FINE_CT may be "1", each differential inverter controller 11 of the voltage controlled oscillator 10 updates the switch signals SWA and SWB to a state in accordance with the state data(n+1) of the coarse phase control signal CRS_CT, and outputs them to the corresponding differential inverter circuit 12. Then, each differential inverter circuit 12 of the voltage controlled oscillator 10 controls the state of the output in accordance with the switch signals SWA and SWB output from the corresponding differential inverter controller 11, while the state of the fine phase control signal FINE_CT may be "1", and terminates the control of the state of the output, after the state of the fine phase control signal FINE_CT becomes "0".

At the time t3, the phase controller 20 outputs a fine phase control signal FINE_CT with a pulse waveform. Further, the rising of the differential clocks CLKP and CLKN to be output from the voltage controlled oscillator 10 has a 90°—delayed phase relative to the rising of the pulse of the fine phase control signal FINE_CT. Therefore, the regulation of the phases of the differential clocks CLKP and CLKN to be output by the voltage controlled oscillator 10 may be completed.

Figure 6:
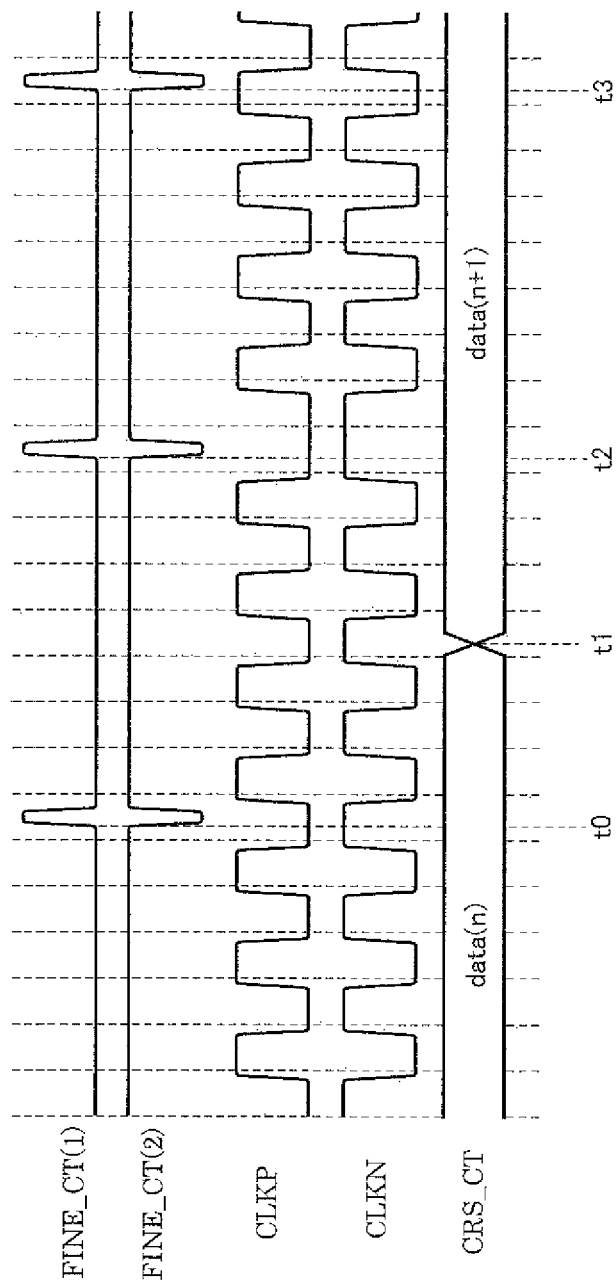
FIG. 6 is a timing chart of various signals in a clock generator according to an embodiment of the present invention.

FIG. 6 is a timing chart of various signals in a clock generator according to an embodiment of the present invention. More specifically, FIG. 6 is a timing chart of various signals in a case where the clock generator 1 rotates the phases of the differential clocks CLKP and CLKN by 180°, in the clock generator 1 according to an embodiment of the present invention.

In FIG. 6, the time t0 to time t3 are the same as those described in FIG. 5. Further, FIG. 6 is the same as FIG. 5, except that the differential clocks CLKP and CLKN have 90°-delayed phases relative to the fine phase control signal FINE_CT at the time t0 and the rotation angle relative to the differential clocks CLKP and CLKN may be 180°.

The transitions of the states of the various signals at the time t1 and time t2 have been described in FIG. 5, and therefore, the description will be omitted. At the time t3, the phase controller 20 may output a fine phase control signal FINE_CT with a pulse waveform. Further, at the time t3, the rising of the differential clocks CLKP and CLKN to be output from the voltage controlled oscillator 10 may have a 270°—delayed phase relative to the rising of the pulse of the fine phase control signal FINE_CT. Therefore, the regulation of the phases of the differential clocks CLKP and CLKN to be output by the voltage controlled oscillator 10 may be completed.

Figure 7:
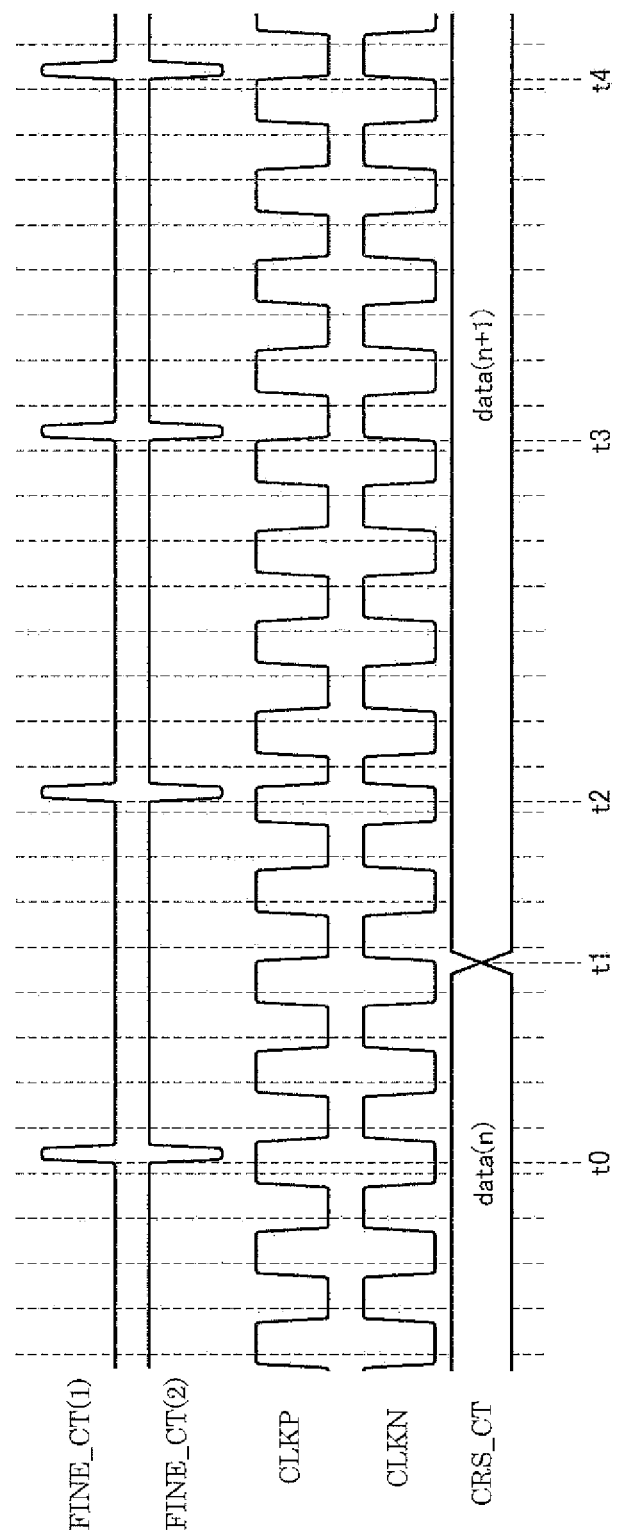
FIG. 7 is a timing chart of various signals in a clock generator according to an embodiment of the present invention.

FIG. 7 is a timing chart of various signals in a clock generator according to an embodiment of the present invention. More specifically, FIG. 7 is a timing chart of various signals in a case where the clock generator 1 rotates the phases of the differential clocks CLKP and CLKN by 270°, in the clock generator 1 according to an embodiment of the present invention.

In FIG. 7, the time t0 to time t3 may be the same as those described in FIG. 5. Further, a time t4 may be defined as a timing when the phase controller 20 outputs the first fine phase control signal FINE_CT with a pulse waveform after the time t3. Further. FIG. 7 may be the same as FIG. 5, except that the differential clocks CLKP and CLKN have 270°-delayed phases relative to the fine phase control signal FINE_CT at the time t0, the rotation angle relative to the differential clocks CLKP and CLKN may be 270°, and the time t4 may be defined.

The transitions of the states of the various signals at the time t1 and the time t2 have been explained in FIG. 5, and therefore, the description will be omitted. At the time t3, the phase controller 20 may output a fine phase control signal FINE_CT with a pulse waveform. At the time t3, the rising of the differential clocks CLKP and CLKN to be output from the voltage controlled oscillator 10 may have an approximately 270°-delayed phase relative to the rising of the pulse of the fine phase control signal FINE_CT.

At the time t4, the phase controller 20 may output a fine phase control signal FINE_CT with a pulse waveform. Further, the rising of the differential clocks CLKP and CLKN to be output from the voltage controlled oscillator 10 may have a 270°-delayed phase relative to the rising of the pulse of the fine phase control signal FINE_CT. The phase difference between the differential clocks CLKP and CLKN and the fine phase control signal FINE_CT at the time t4 may have a more enhanced accuracy than that at the time t3.

Namely, the clock generator 1 according to an embodiment of the present invention, in the regulation of the phases of the differential clocks CLKP and CLKN, can further enhance the accuracy of the regulation of the phases, by regulating the phases with the same setting.

Figure 8:
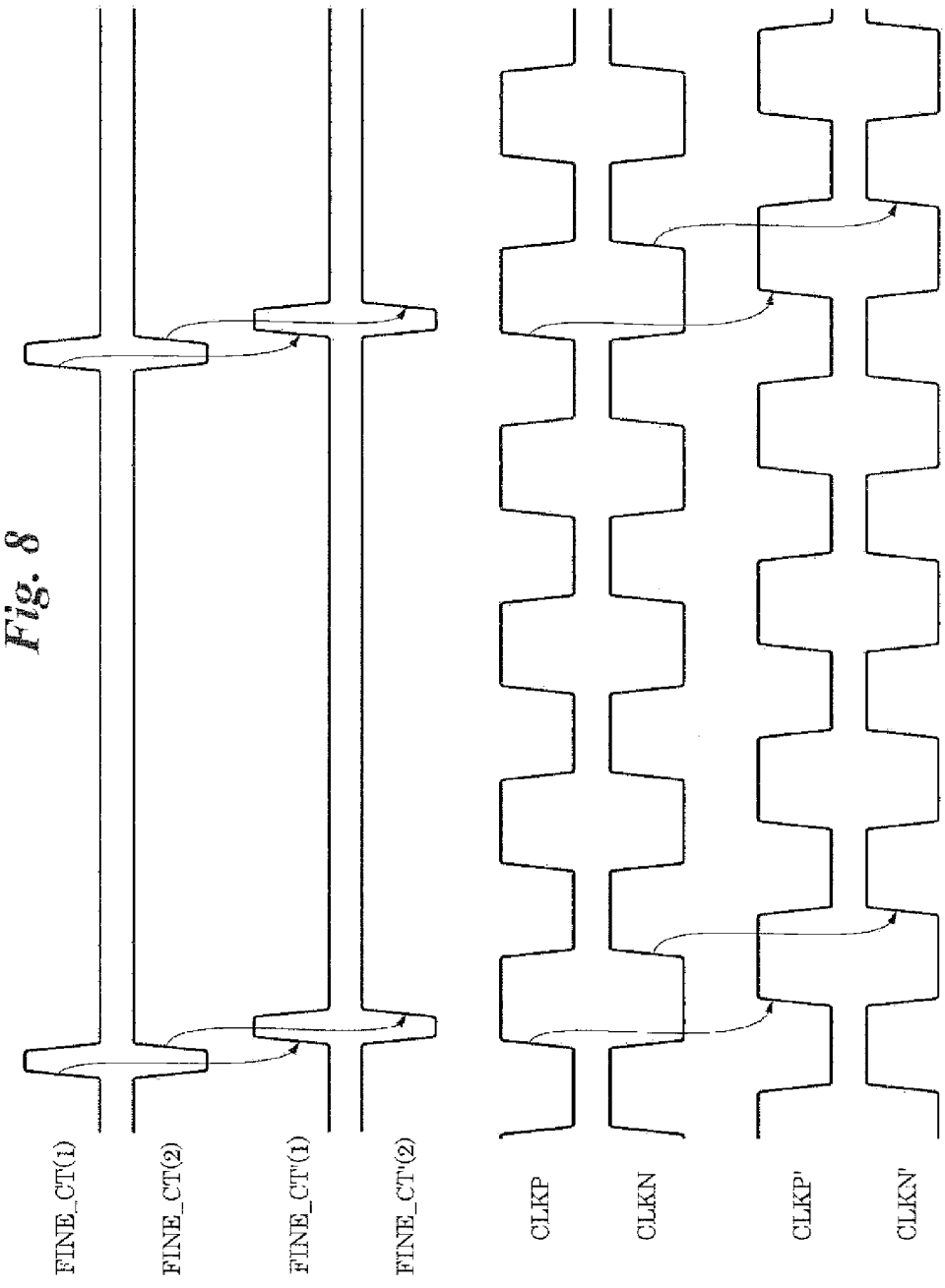
FIG. 8 is a timing chart of various signals in a clock generator according to an embodiment of the present invention.

FIG. 8 is a timing chart of various signals in a clock generator according to an embodiment of the present invention. More specifically, FIG. 8 is a timing chart of various signals in a case where the phase controller 20 alters the timing of outputting the fine phase control signal FINE_CT with a pulse waveform, in the clock generator 1 according to an embodiment of the present invention.

In FIG. 8, a fine phase control signal in the case where the phase controller 20 delays the timing of outputting the fine phase control signal FINE_CT with a pulse waveform is defined as a fine phase control signal FINE_CT'. Further, the positive and negative signals of the fine phase control signal FINE_CT' are defined as fine phase control signals FINE_CT'(1) and FINE_CT'(2), respectively. Further, differential clocks to be output by the clock generator 1 in the case where the phase controller 20 delays the timing of outputting the fine phase control signal FINE_CT with a pulse waveform are defined as differential crocks CLKP' and CLKN'.

As shown in FIG. 8, in a case where the phase controller 20 may delay the timing of outputting the fine phase control signal FINE_CT with a pulse waveform, the phases of the differential clocks CLKP and CLKN to be output by the clock generator 1 may be delayed in accordance with the delay of the generation of the pulse of the fine phase control signal FINE_CT.

Since the phase controller 20 may control the timing of outputting the fine phase control signal FINE_CT with a pulse waveform, the clock generator 1 according to an embodiment of the present invention can regulate the phases of the differential clocks CLKP and CLKN. Further, as described above, the clock generator 1 can regulate the phases of the differential clocks CLKP and CLKN to intended phases, by controlling the state of the output of each differential inverter circuit 12 of the voltage controlled oscillator 10 with the coarse phase control signal CRS_CT. Accordingly, the clock generator 1 according to an embodiment of the present invention can regulate the phases of the differential clocks CLKP and CLKN with a higher accuracy, by combination between the phase regulation method with the coarse phase control signal CRS_CT and the phase regulation method with the fine phase control signal FINE_CT.

Figure 9:
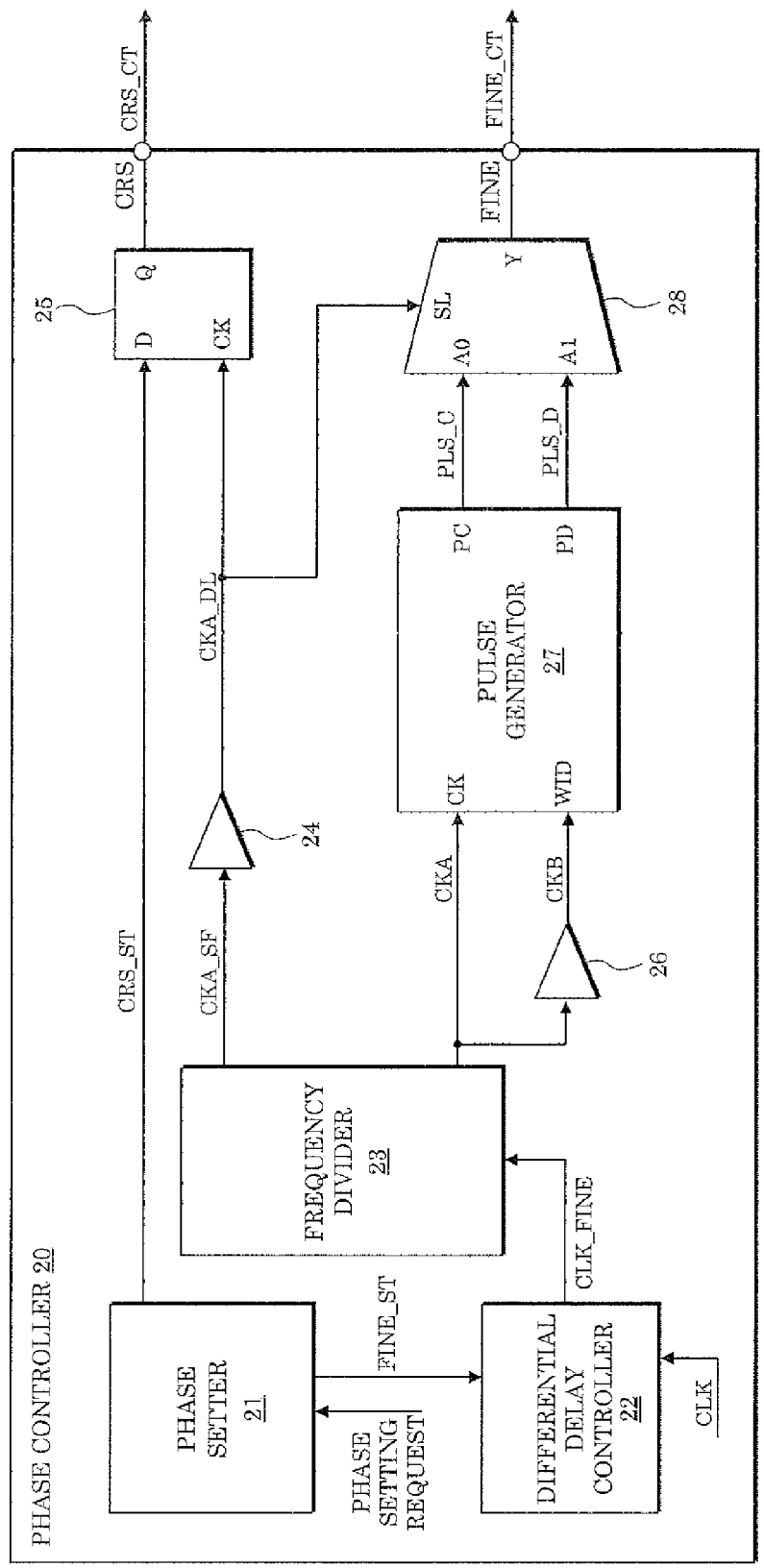
FIG. 9 is a block diagram showing an example of a phase controller in a clock generator according to an embodiment of the present invention.

FIG. 9 is a block diagram showing an example of a phase controller in a clock generator according to an embodiment of the present invention. As shown in FIG. 9, the phase controller 20 may be configured to include a phase setter 21, a differential delay controller 22, a frequency divider 23, delay circuits 24 and 26, an output controller 25, a pulse generator 27, and a selection circuit 28.

For example, based on a phase setting request from the exterior, the phase setter 21 may set the phases of the differential clocks CLKP and CLKN to be output by the voltage controlled oscillator 10, and output the coarse phase setting of the phase setting to the output controller 25, as a coarse phase setting signal CRS_ST, and output the fine phase setting to the differential delay controller 22, as a fine phase setting signal FINE_CT.

Specifically, for example, based on a phase setting request from the exterior, the phase setter 21 may select either one of the inexecution of the output control, the control of the states of the differential output terminals op and on to "1" and "0", respectively, and the control of the states of the differential output terminals op and on to "0" and "1", respectively, for each differential inverter circuit 12. The phase setter 21 may generate the coarse phase setting signal CRS_ST having the states of the "non-control", "positive logic control" and "negative logic control" that correspond to the selection results respectively, and then output the signal to a data terminal D of the output controller 25. The coarse phase setting signal CRS_CT may be, for example, a multi-bit signal or parallel signals, and each bit or each signal of the coarse phase setting signal CRS_ST may indicate a coarse phase setting corresponding to each differential inverter circuit 12 for which the output control may be performed.

It is noted that the coarse phase setting may be a phase setting corresponding to each differential clock to be output by the differential inverter circuits 12 in the voltage controlled oscillator 10. As the settable phases by the coarse phase setting, which may be coarser than those by the fine phase setting, it is possible to set phases corresponding to steps whose number is a value resulting from dividing 360° by (the number of the differential inverter circuits 12×2). Further, the fine phase setting may be a phase setting for performing a further fine regulation for the differential clock in addition to the coarse phase setting. As the settable phases by the fine phase setting, which may be finer than those by the coarse phase setting, it is possible to set phases corresponding to predetermined steps.

The differential delay controller 22 may be, for example, a differential inverter circuit that can control the delay time of the output signal relative to the input signal. The differential delay controller 22 may provide, to a predetermined differential clock CLK, a delay time corresponding to the fine phase setting signal FINE_CT output from the phase setter 21, and output the differential clock to the frequency divider 23, as a fine phase differential clock CLK_FINE.

The frequency divider 23 may receive the fine phase differential clock CLK_FINE output from the differential delay controller 22, and generate a differential clock CKA and a shift differential clock CKA_SF, by performing frequency divisions for fine phase clocks CLK_FINE(1) and CLK_FINE(2) of the fine phase differential clock CLK_FINE in accordance with predetermined division ratios respectively. The frequency divider 23 may output the differential clock CKA to a clock terminal CK of the pulse generator 27 and the delay circuit 26, and output the shift differential clock CKA_SF to the delay circuit 24.

The delay circuit 24 may be, for example, a differential buffer. The delay circuit 24 may generate a delay differential clock CKA_DL for synchronizing the coarse phase control signal CRS_CT and the fine phase control signal FINE_CT, from the shift differential clock CKA_SF output from the frequency divider 23, to output the clock to the output controller 25 and the selection circuit 28. Specifically, the delay circuit 24 may provide a predetermined delay time to the shift differential clock CKA_SF output from the frequency divider 23, and output it, as the delay differential clock CKA_DL, to a clock terminal CK of the output controller 25 and a selection terminal SL of the selection circuit 28.

The output controller 25 may be a D-type flip-flop, for example. The output controller 25 may output the coarse phase setting signal CRS_ST to the coarse terminal CRS of the voltage controlled oscillator 10, as the coarse phase control signal CRS_CT, based on the delay differential clock CKA_DL. Specifically, based on the delay differential clock CKA_DL output from the delay circuit 24 to the clock terminal CK, the output controller 25 may set the coarse phase setting signal CRS_CT output from the phase setter 21 to the data terminal D, as the coarse phase control signal CRS_CT, and output the signal from an output terminal Q to the coarse terminal CRS of the voltage controlled oscillator 10.

The delay circuit 26 may be, for example, a differential buffer The delay circuit 26 may provide, to the input signal, a delay time Δd1 corresponding to the pulse width of the fine phase control signal FINE_CT, to output it as the output signal. Specifically, the delay circuit 26 may provide the delay time MI corresponding to the pulse width of the fine phase control signal FINE_CT, to the differential clock CKA output from the frequency divider 23, and then output it to a pulse width terminal WID of the pulse generator 27, as a differential clock CKB.

The pulse generator 27 and the selection circuit 28 may constitute a differential exclusive disjunction circuit. The differential exclusive disjunction circuit, which may be a logic circuit, may judge the states of the differential clock CKA output from the frequency divider 23 and the differential clock CKB output from the delay circuit 26. In a case of judging that the states of the differential clocks CKA and CKB coincide, the differential exclusive disjunction circuit may generate the fine phase control signal FINE_CT having a state of "0". On the other hand, in a case of judging that the states of the differential clocks CKA and CKB are different, the differential exclusive disjunction circuit may generate the fine phase control signal FINE_CT having a state of "1". Then, the differential exclusive disjunction circuit may output the generated fine phase control signal FINE_CT to the voltage controlled oscillator 10.

The pulse generator 27 may generate differential pulse signals PLS_C and PLS_D having different phases from each other, based on the differential clock CKA output from the frequency divider 23 and the differential clock CKB output from the delay circuit 26, and may output the signals to the selection circuit 28.

Specifically, the pulse generator 27 may generate the differential pulse signals PLS_C and PLS_D, based on the differential clock CKA output from the frequency divider 23 to the clock terminal CK and the differential clock CKB output from the delay circuit 26 to the pulse width terminal WID, and output the signals from differential output terminals PC and PD to input terminals A0 and A1 of the selection circuit 28, respectively. It is noted that the differential pulse signal PLS_C may be synchronous with the rising edge of the differential clock CKA, and the differential pulse signal PLS_D may be synchronous with the falling edge of the differential clock CKA. Further, the pulse widths of the differential pulse signals PLS_C and PLS_D may be determined based on the delay time given to the differential clock CKA by the delay circuit 26.

The selection circuit 28 may be, for example, a multiplexer. The selection circuit 28 may select either one of the differential pulse signals PLS_C and PLS_D in accordance with the state of the delay differential clock CKA_DL, to output the selected signal to the fine terminal FINE of the voltage controlled oscillator 10 as the fine phase control signal FINE_CT.

Specifically, the selection circuit 28 may judge a state of the delay differential clock CKA_DL output from the delay circuit 24. In a case of judging that the state of the delay differential clock CKA_DL is, for example, "0", the selection circuit 28 may select, as the fine phase control signal FINE_CT, the differential pulse signal PLS_C output from the pulse generator 27 to the input terminal A0, and then output the selected signal from an output terminal Y to the fine terminal FINE of the voltage controlled oscillator 10. On the other hand, in a case of judging that the state of the delay differential clock CKA_DL is, for example, "1", the selection circuit 28 may select, as the fine phase control signal FINE_CT, the differential pulse signal PLS_D output from the pulse generator 27 to the input terminal A1, and then output the selected signal from the output terminal Y to the fine terminal FINE of the voltage controlled oscillator 10.

Figure 10:
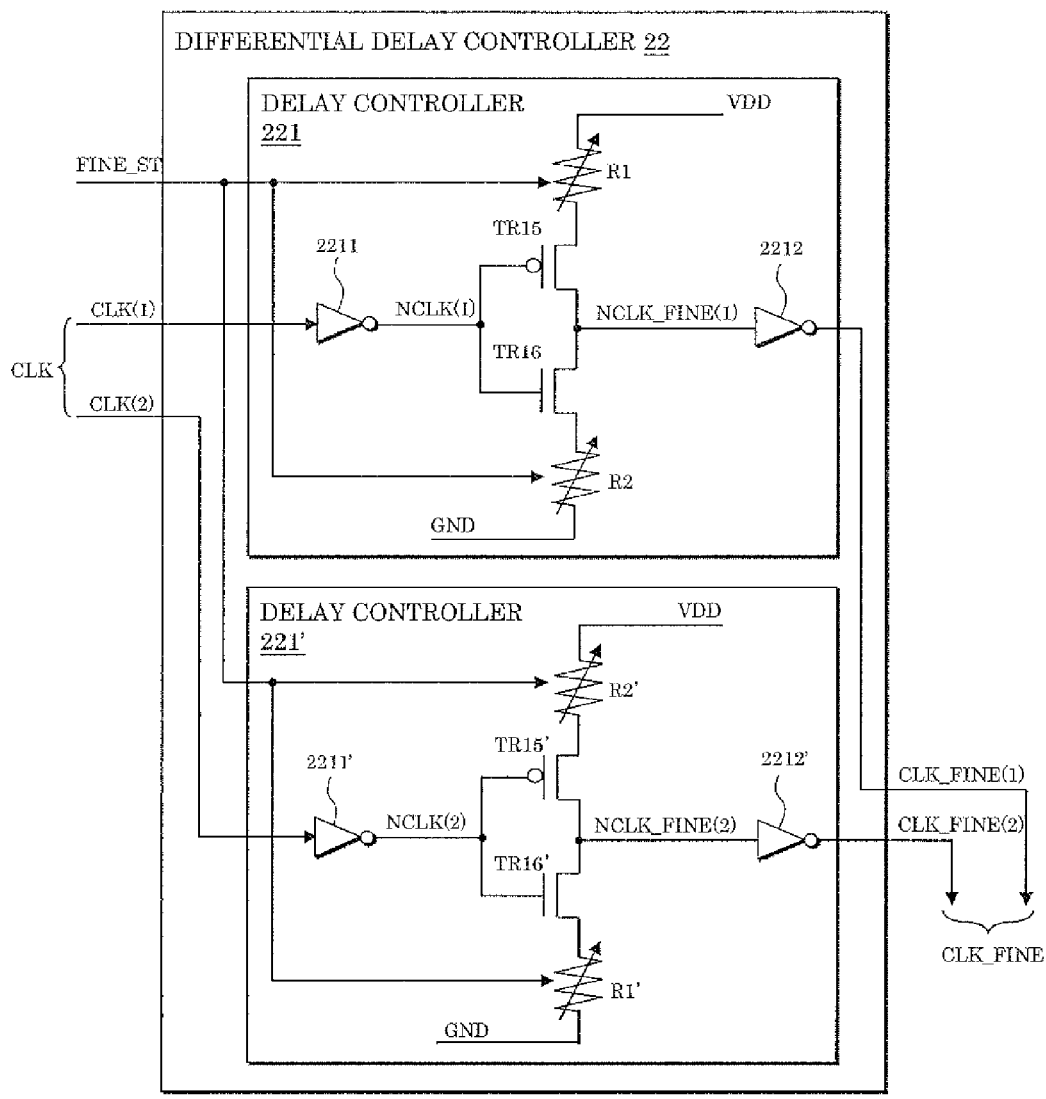
FIG. 10 is a circuit diagram showing an example of a differential delay controller in a clock generator according to an embodiment of the present invention.

FIG. 10 is a circuit diagram showing an example of a differential delay controller in a clock generator according to an embodiment of the present invention. As shown in FIG. 10, the differential delay controller 22 may be configured to include delay controllers 221 and 221'. In this disclosure, the positive and negative clocks of the fine phase differential clock CLK_FINE are defined as fine phase clocks CLK_FINE(1) and CLK_FINE(2), respectively, and the positive and negative clocks of the differential clock CLK are defined as clocks CLK(1) and CLK(2), respectively.

The delay controller 221 may be an inverter circuit that can control the delay time of the output signal relative to the input signal, and may be configured to include, for example, logical negation circuits 2211 and 2212, variable resistances R1 and R2, and transistors TR15 and TR16. Further, the delay controller 221' may be configured to include, for example, logical negation circuits 2211' and 2212', variable resistances R1' and R2', and transistors TR15' and TR16'. As described above, the delay controllers 221 and 221' may constitute the differential delay controller 22. The delay controllers 221 and 221' may provide the delay time corresponding to the fine phase setting signal FINE_CT, to the clocks CLK(1) and CLK(2) respectively, perform logical negation, and then output the clocks to the frequency divider 23 as the fine phase clocks CLK_FINE(1) and CLK_FINE(2), respectively.

The logical negation circuits 2211 and 2212 may be, for example, inverter circuits the logical negation circuit 2211 and 2212 may reduce influence on the delay controller 221 from the circuits connected at the previous stage and next stage to the delay controller 221. Specifically, the logical negation circuit 2211 may perform logical negation for the clock CLK(1), output the clock to the gates of the transistors TR15 and TR16, as an inverted clock NCLK(1), and reduce influence on the delay controller 221 from the circuit connected at the previous stage. Further, the logical negation circuit 2212 may perform logical negation for an inverted fine phase clock NCLK_FINE(1), output the clock to the frequency divider 23, as the fine phase clock CLK_FINE(1), and reduce the influence on the delay controller 221 from the frequency divider 23.

The transistors TR15 and TR16 may constitute an inverter circuit. The transistors TR15 and TR16 may perform logical negation for the inverted clock NCLK(1) output from the logical negation circuit 2211, and furthermore, by giving a delay time determined based on the variable resistances R1 and R2 described later, generate the inverted fine phase clock NCLK_FINE(1) to output the clock from the drains of the transistors TR15 and TR16 to the logical negation circuit 2212.

The transistor TR15 may be a, for example, P-type transistor. Specifically, based on the inverted clock NCLK(1), the transistor TRIS may switch the ON/OFF of the current that flows through the variable resistance R1 and the transistor TR15 from a power line VDD. In the transistor TR15, the drain may be connected with the input terminal of the logical negation circuit 2212 and the drain of the transistor TR16. Meanwhile, the source may be connected with the variable resistance R1, and the gate may be connected with the output terminal of the logical negation circuit 2211 and the gate of the transistor TR16.

The transistor TR16 may be, for example, an N-type transistor. Specifically, based on the inverted clock NCLK(1), the transistor TR16 may switch the ON/OFF of the current that flows from the variable resistance R2 and the transistor TR16 to a grounding wire GND. In the transistor TR16, the drain may be connected with the input terminal of the logical negation circuit 2212 and the drain of the transistor TR15. Meanwhile, the source may be connected with the variable resistance R2, and the gate may be connected with the output terminal of the logical negation circuit 2211 and the gate of the transistor TR15.

The variable resistances R1 and R2 may be, for example, polysilicon resistances or diffusion resistances. The resistance values may be controlled based on the fine phase setting signal FINE_CT, and thereby, the duty ratio of the inverted fine phase clock NCLK_FINE(1) may be controlled. Specifically, the variable resistance R1 may have one end connected with the power line VDD and have the other end connected with the source of the transistor TR15. Further, the variable resistance R2 may have one end connected with the grounding wire GND and have the other end connected with the source of the transistor TR16. In the delay time to be given to the inverted clock NCLK(1) by the delay controller 221, the delay time of the rising time may increase as the resistance value of the variable resistance R1 increases, and decrease as the resistance value of the variable resistance R1 decreases. On the other hand, in the delay time to be given to the inverted clock NCLK(1) by the delay controller 221, the delay time of the falling time may increase as the resistance value of the variable resistance R2 increases, and decrease as the resistance value of the variable resistance R2 decreases.

The total of the resistance values of the variable resistances R1 and R2 may be controlled so as to be always constant (e.g., 5 [kΩ]), by the fine phase setting signal FINE_CT. That is, when the resistance value of the variable resistance R1 rises, the resistance value of the variable resistance R2 may fall, and meanwhile, when the resistance value of the variable resistance R1 falls, the resistance value of the variable resistance R2 may rise.

The delay controller 221' may be configured by the exchange of the variable resistances R1 and R2 of the delay controller 221 for each other. This is because it is preferable that the delay times of the rising time and falling time of the fine phase clock CLK_FINE(1) coincide with the delay times of the falling time and rising time of the fine phase clock CLK_FINE(2), respectively, since the clocks CLK(1) and CLK(2) input to the delay controllers 221 and 221' have opposite phases to each other. Operation of the delay controller 221' may be the same as that of the delay controller 221, and therefore, the description will be omitted.

Assume that the resistance values of the variable resistances R1 and R2 can be varied in 64 levels (6 bits), for example. In this case, the delay controller 221 may determine the resistance values of the variable resistances R1 and R2 such that the variable resistances R1 and R2 can change the duty ratio of the fine phase differential clock CLK_FINE(1) by about ±15%. The fine phase differential clock CLK_FINE may be frequency-divided into one-half by the frequency divider 23, be delayed by the delay circuit 24, and become the delay differential clock CKA_DL. Therefore, the delay controller 221 may change the phase of the delay differential clock CKA_DL by ±27°, by changing the duty ratio of the fine phase differential clock CLK_FINE in a range of ±15%.

In a case where the delay controller 221 changes the phase of the delay differential clock CKA_DL by ±27°, the clock generator 1, by the fine phase control signal FINE_CT, can control the phases of the differential clocks CLKP and CLKN in 64 grades within a range of 54° by 27°×2 (i.e., a step of about 1°, by liner approximation). In this case, when the number of the differential inverter circuits 12 of the ring oscillator of the voltage controlled oscillator 10 may be four, the differential inverter circuits 12 can output differential clocks having phases that are different by 45° from each other, and thereby, the clock generator 1 can regulate the phases of the differential clocks CLKP and CLKN from 1° to 360°, on a 1° basis.

In this example, the number of the differential inverter circuits 12 of the ring oscillator of the voltage controlled oscillator 10 may be eight, in consideration of a margin, and the differential inverter circuits 12 output differential clocks having phases that are different by 22.5° from each other.

The clock generator 1 in the example can regulate the phases of the differential clocks CLKP and CLKN from 1° to 360°, on a 1° basis. As described above, the number of the differential inverter circuits 12 is not limited to this, and an arbitrary number may be provided.

Figure 11:
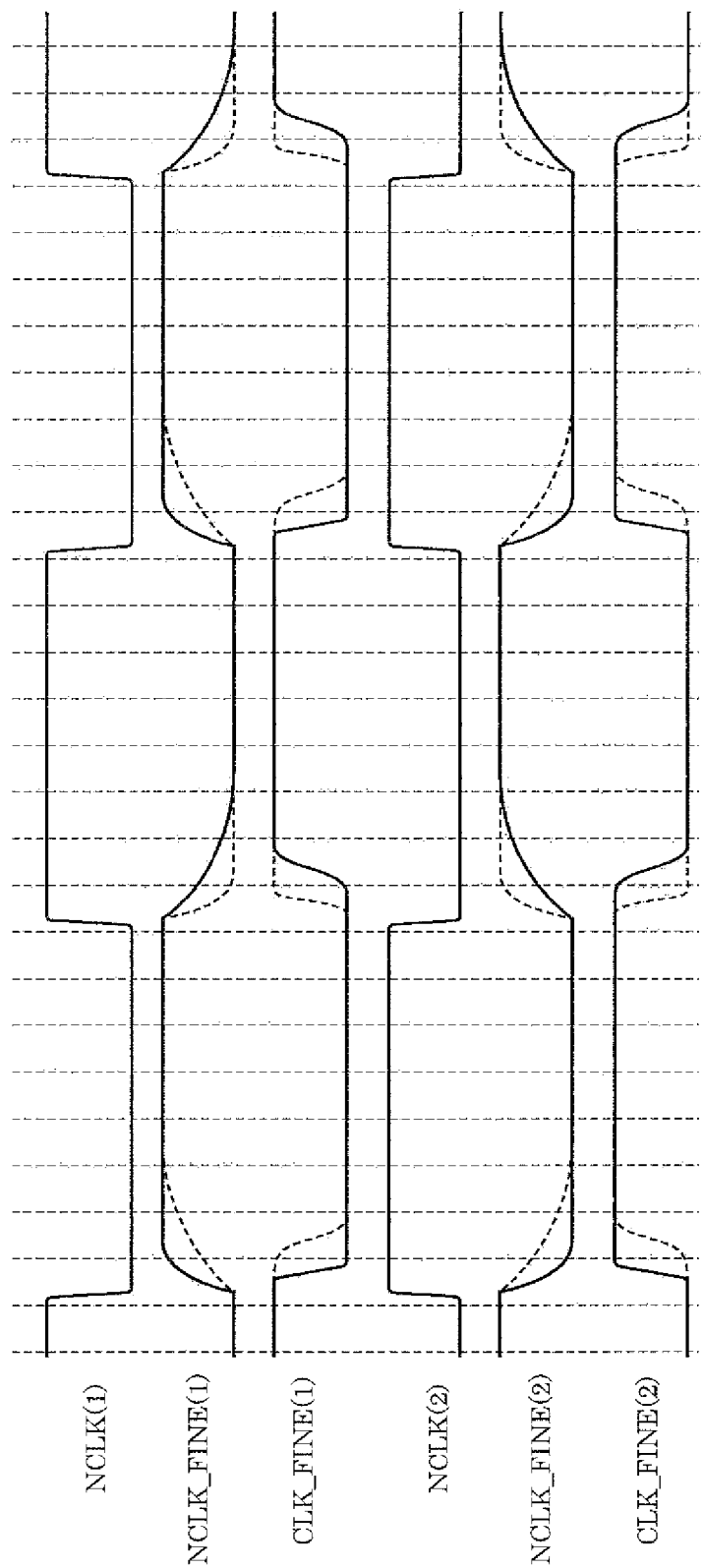
FIG. 11 is a timing chart of various control signals of a differential delay controller in a clock generator according to an embodiment of the present invention.

FIG. 11 is a timing chart of various control signals of a differential delay controller in a clock generator according to an embodiment of the present invention. In a case where the inverted clock NCLK(1) shown in FIG. 11 is input to the gates of the transistors TR15 and TR16, the transistors TR15 and TR16 may provide, to the inverted clock NCLK(1), a delay time in accordance with the resistance values of the variable resistances R1 and R2, and then output it to the logical negation circuit 2212, as the inverted fine phase clock NCLK_FINE(1).

In a case where the resistance value of the variable resistance R1 is large and the resistance value of the variable resistance R2 is small, the transistors TR15 and TR16 may generate the inverted fine phase clock NCLK_FINE(1) as shown by the broken line in FIG. 11, and output the signal to the logical negation circuit 2212. Then, in accordance with the inverted fine phase clock NCLK_FINE(1) shown by the broken line, the logical negation circuit 2212 may generate the fine phase clock CLK_FINE(1) as shown by the broken line, and output it to the frequency divider 23.

On the other hand, in a case where the resistance value of the variable resistance R1 is small and the resistance value of the variable resistance R2 is large, the transistors TR15 and TR16 may generate the inverted fine phase clock NCLK_FINE(1) as shown by the solid line in the figure, and output the signal to the logical negation circuit 2212. Then, in accordance with the inverted fine phase clock NCLK_FINE(1) as shown by the solid line, the logical negation circuit 2212 may generate the fine phase clock CLK_FINE(1) as shown by the solid line, and output it to the frequency divider 23.

Further, in a case where the inverted clock NCLK(2) is input to the gates of the transistors TR15' and TR16', the transistors TR15' and TR16' may provide, to the inverted clock NCLK(2), a delay time in accordance with the resistance values of the variable resistances R1' and R2', and output it to the logical negation circuit 2212', as the inverted fine phase clock NCLK_FINE(2).

In a case where the resistance value of the variable resistance R1' is large and the resistance value of the variable resistance R2' is small, the transistors TR15' and TR16' may generate the inverted fine phase clock NCLK_FINE(2) as shown by the solid line in FIG. 11, and output it to the logical negation circuit 2212'. Then, in accordance with the inverted fine phase clock NCLK_FINE(2) as shown by the solid line, the logical negation circuit 2212' may generate the fine phase clock CLK_FINE(2) as shown by the solid line, and output it to the frequency divider 23.

On the other hand, in a case where the resistance value of the variable resistance R1' is small and the resistance value of the variable resistance R2' is large, the transistors TR15' and TR16' may generate the inverted fine phase clock NCLK_FINE(2) as shown by the broken line in FIG. 11, and output it to the logical negation circuit 2212'. Then, in accordance with the inverted fine phase clock NCLK_FINE(2) as shown by the broken line, the logical negation circuit 2212' may generate the fine phase clock CLK_FINE(2) as shown by the broken line, and output it to the frequency divider 23.

Figure 12:
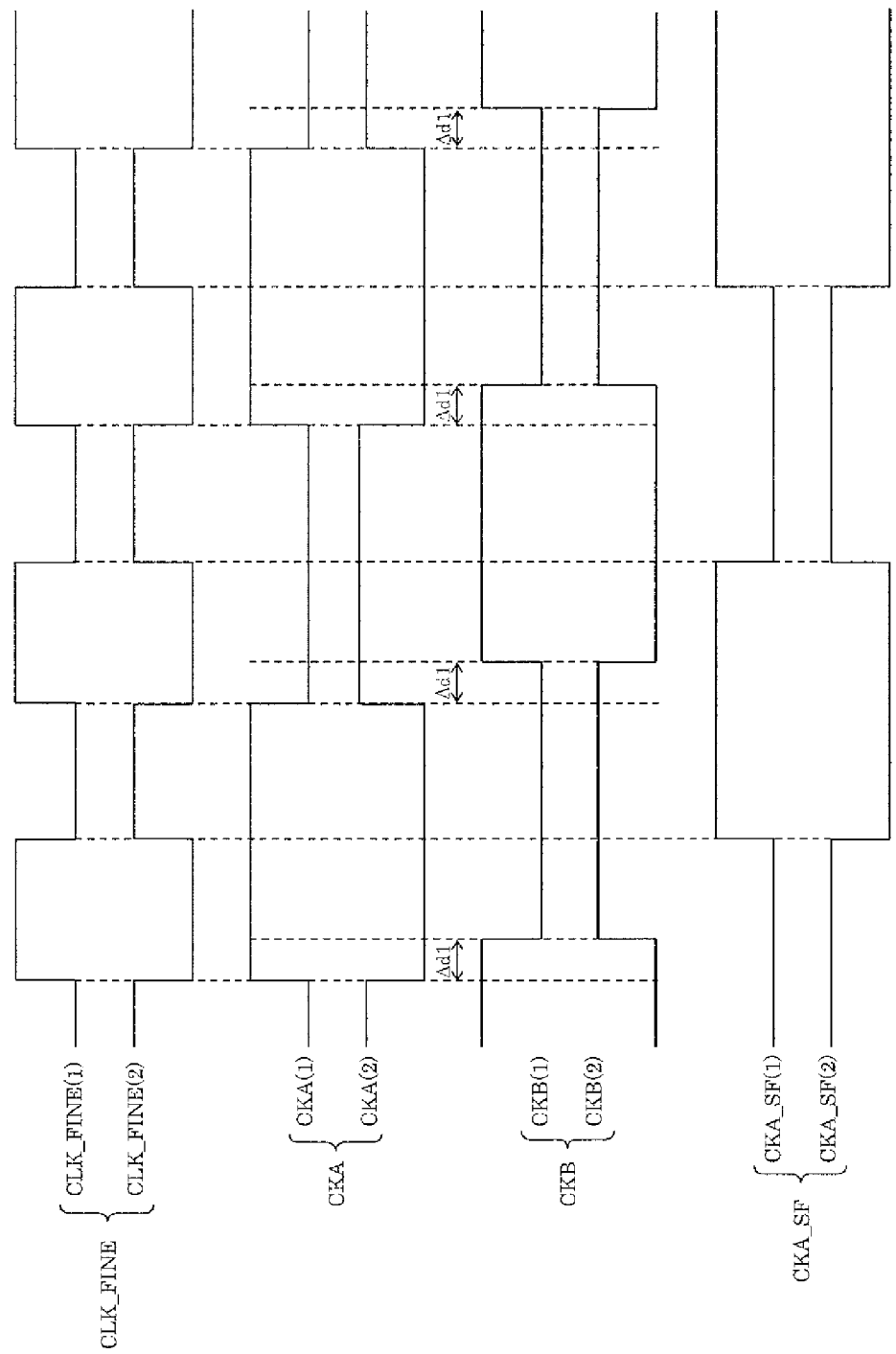
FIG. 12 is a timing chart of various control signals of a phase controller in a clock generator according to an embodiment of the present invention.

FIG. 12 is a timing chart of various control signals of a phase controller in a clock generator according to an embodiment of the present invention. More specifically, FIG. 12 is a timing chart showing the relationship of the fine phase differential clock CLK_FINE to be input to the frequency divider 23, the shift differential clock CKA_SF and differential clock CKA to be output from the frequency divider 23, and the differential clock CKB to be output from the delay circuit 26, in the phase controller 20 of the clock generator 1 according to an embodiment of the present invention.

In this disclosure, the positive and negative clocks of the differential clock CKA are defined as clocks CKA(1) and CKA(2), respectively. Further, the positive and negative clocks of the differential clock CKB are defined as clocks CKB(1) and CKB(2), respectively. Furthermore, the positive and negative clocks of the shift differential clock CKA_SF are defined as shift clocks CKA_SF(1) and CKA_SF(2), respectively.

Referring to FIG. 12, when the fine phase differential clock CLK_FINE alternating at a predetermined frequency is input to the frequency divider 23, the frequency divider 23 may generate the differential clock CKA alternating based on the rising edge of the fine phase clock CLK_FINE(1), which is the positive side. Further, the frequency divider 23 may generate the shift differential clock CKA_SF alternating based on the rising edge of the fine phase clock CLK_FINE(2), which is the negative side.

Namely, the frequency divider 23 may frequency-divide the fine phase differential clock CLK_FINE into one-half, and thereby generate the differential clock CKA and the shift differential clock CKA_SF having a 90°-delayed phase relative to the phase of the differential clock CKA.

Further, as described above, the delay circuit 26 may provide, to the differential clock CKA generated by the frequency divider 23, a predetermined delay time Δd1 that corresponds to the pulse width of the fine phase control signal FINE_CT, and a delay time Δd2 that is a time equivalent to the half-cycle of the differential clock CKA at most, and generate the differential clock CKB. That is, by giving the delay time Δd1 to the differential clock CKA, the delay circuit 26 may generate the differential clock CKB having a phase that is delayed by the delay time Δd1 relative to the phase of the differential clock CKA.

Figure 13:
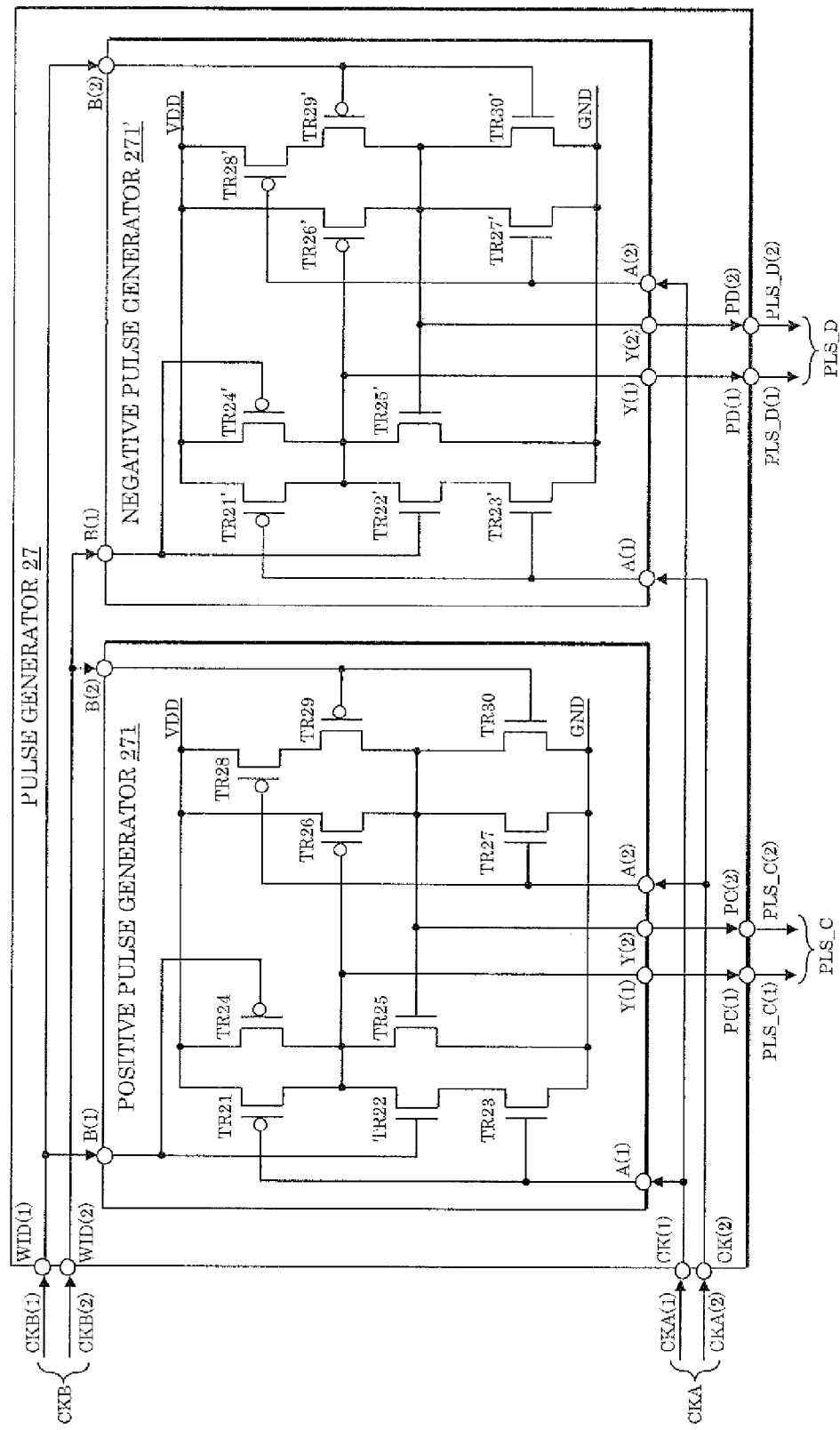
FIG. 13 is a circuit diagram showing an example of a pulse generator in a clock generator according to an embodiment of the present invention.

FIG. 13 is a circuit diagram showing an example of a pulse generator in a clock generator according to an embodiment of the present invention. As shown in FIG. 13, the pulse generator 27 may be configured to include, for example, a positive pulse generator 271 and a negative pulse generator 271'.

In this disclosure, the positive and negative signals of the differential pulse signal PLS_C are defined as pulse signals PLS_C(1) and PLS_C(2), respectively. Further, the positive and negative signals of the differential pulse signal PLS_D are defined as pulse signals PLS_D(1) and PLS_D(2), respectively. Further, the clocks CKB(1) and CKB(2) may be input to pulse width terminals WID(1) and WID(2) of the pulse generator 27, respectively, and the clocks CKA(1) and CKA(2) may be input to differential input terminals CK(1) and CK(2), respectively. Further, the pulse generator 27 may output the pulse signals PLS_C(1) and PLS_C(2) from differential output terminals PC(1) and PC(2), respectively, and output the pulse signals PLS_D(1) and PLS_D(2) from differential output terminals PD(1) and PD(2), respectively.

The positive pulse generator 271 may perform non-conjunction for the clock CKA(1) input to a differential input terminal A(1) and the clock CKB(1) input to a differential input terminal B(1), and perform non-disjunction for the clock CKA(2) input to a differential input terminal A(2) and the clock CKB(2) input to the a differential input terminal B(2), and then output the results of the non-conjunction and the non-disjunction from the differential output terminal PC, as the differential pulse signal PLS_C. The positive pulse generator 271 may be configured to include transistors TR21 to TR30, for example.

Specifically, the positive pulse generator 271 may perform non-conjunction for the clock CKA(1) output from the frequency divider 23 to the differential input terminal A(1) and the clock CKB(1) output from the delay circuit 26 to the differential input terminal B(1), and output the result of non-conjunction, as the pulse signal PLS_C(1), from a differential output terminal Y(1) to the input terminal A0 of the selection circuit 28. Further, the positive pulse generator 271 may perform non-disjunction for the clock CKA(2) output from the frequency divider 23 to the differential input terminal A(2) and the clock CKB(2) output from the delay circuit 26 to the differential input terminal B(2), and output the result of the non-disjunction, as the pulse signal PLS_C(2), from a differential output terminal Y(2) to the input terminal A0 of the selection circuit 28.

By way of this, in a case where both of the states of the differential clocks CKA and CKB are "1", the positive pulse generator 271 may generate and output the differential pulse signal PLS_C having a state of "0". On the other hand, in a case where at least any one of the states of the differential clocks CKA and CKB is "0", the positive pulse generator 271 may generate and output the differential pulse signal PLS_C having a state of "1".

The negative pulse generator 271' may perform non-conjunction for the clock CKA(2) input to a differential input terminal A(1) and the clock CKB(2) input to a differential input terminal B(1), and perform non-disjunction for the clock CKA(1) input to a differential input terminal A(2) and the clock CKB(1) input to a differential input terminal B(2), and the output the results of the non-conjunction and the non-disjunction from the differential output terminal PD, as the differential pulse signal PLS_D. The negative pulse generator 271' may be configured to include, for example, transistors TR21' to TR30'.

Specifically, the negative pulse generator 271' may perform non-conjunction for the clock CKA(2) output from the frequency divider 23 to the differential input terminal A(1) and the clock CKB(2) output from the delay circuit 26 to the differential input terminal B(1), and then output the result of non-conjunction, as the pulse signal PLS_D(1), from a differential output terminal Y(1) to the input terminal A1 of the selection circuit 28. Further, the negative pulse generator 271' may perform non-disjunction for the clock CKA(1) output from the frequency divider 23 to the differential input terminal A(2) and the clock CKB(1) output from the delay circuit 26 to the differential input terminal B(2), and then output the result of the non-disjunction, as the pulse signal PLS_D(2), from a differential output terminal Y(2) to the input terminal A1 of the selection circuit 28.

By way of this, in a case where both of the states of the differential clocks CKA and CKB are "0", the negative pulse generator 271' may generate and output the differential pulse signal PLS_D having a state of "0". On the other hand, in a case where at least any one of the states of the differential clocks CKA and CKB is "1", the negative pulse generator 271' may generate and output the differential pulse signal PLS_D having a state of "1".

Next, the configuration of the positive pulse generator 271 and the operation of the transistors TR21 to TR30 will be explained in detail. Since the configuration of the negative pulse generator 271' and the operation of the transistors TR21' to TR30' may be the same as the positive pulse generator 271, except that there are differences from the positive pulse generator 271 in the differential clocks to be input and the differential pulse signals to be output, the explanation will be omitted.

The transistor TR21 may be, for example, a P-type transistor. Specifically, the transistor TR21 may control the ON/OFF thereof based on the clock CKA(1), and thereby, determine the electric potential of the differential output terminal Y(1). Further, in the transistor TR21, the drain may be connected with the differential output terminal Y(1), the drains of the transistors TR22, TR24 and TR25, and the gate of the transistor TR26. Meanwhile, the source may be connected with the power line VDD, and furthermore, the gate may be connected with the differential input terminal A(1) and the gate of the transistor TR23.

The transistor TR22 may be, for example, an N-type transistor. Specifically, the transistor TR22 may control the ON/OFF thereof based on the clock CKB(1), and thereby, determine the electric potential of the differential output terminal Y(1). Further, in the transistor TR22, the drain may be connected with the differential output terminal Y(1), the drains of the transistors TR21, TR24 and TR25, and the gate of the transistor TR26. Meanwhile, the source may be connected with the drain of the transistor TR23, and furthermore, the gate may be connected with the differential input terminal B(1).

The transistor TR23 may be, for example, an N-type transistor. Specifically, the transistor TR23 may control the ON/OFF thereof based on the clock CKA(1), and thereby, determine the electric potential of the differential output terminal Y(1). Further, in the transistor TR23, the drain may be connected with the source of the transistor TR22. Meanwhile, the source may be connected with the grounding wire GND, and furthermore, the gate may be connected with the differential input terminal A(1) and the gate of the transistor TR21.

The transistor TR24 may be, for example, a P-type transistor. Specifically, the transistor TR24 may control the ON/OFF thereof based on the clock CKB(1), and thereby, determine the electric potential of the differential output terminal Y(1). Further, in the transistor TR24, the drain may be connected with the differential output terminal Y(1), the drains of the transistors TR21, TR22 and TR25, the gate of the transistor TR26. Meanwhile, the source may be connected with the power line VDD, and furthermore, the gate may be connected with the differential input terminal B(1).

The transistor TR25 may be, for example, an N-type transistor. Specifically, the transistor TR25 may control the ON/OFF of itself based on the state of the differential output terminal Y(2), and thereby, determine the electric potential of the differential output terminal Y(1). Further, in the transistor TR25, the drain may be connected with the differential output terminal Y(1), the drains of the transistors TR21, TR22 and TR24, and the gate of the transistor TR26. Meanwhile, the source may be connected with the grounding wire GND, and furthermore, the gate may be connected with the differential output terminal Y(2) and the drains of the transistors TR26, TR27, TR29 and TR30.

The transistor TR26 may be, for example, a P-type transistor. Specifically, the transistor TR26 may control the ON/OFF thereof based on the state of the differential output terminal Y(1), and thereby, determine the electric potential of the differential output terminal Y(2). Further, in the transistor TR26, the drain may be connected with the differential output terminal Y(2), the drains of the transistors TR27. TR29 and TR30, and the gate of the transistor TR25. Meanwhile, the source may be connected with the grounding wire VDD, and furthermore, the gate may be connected with the differential output terminal Y(1).

The transistor TR27 may be, for example, an N-type transistor. Specifically, the transistor TR27 may control the ON/OFF thereof based on the clock CKA(2), and thereby, determine the electric potential of the differential output terminal Y(2). Further, in the transistor TR27, the drain may be connected with the differential output terminal. Y(2), the drains of the transistors TR26, TR29 and TR30, and the gate of the transistor TR25. Meanwhile, the source may be connected with the grounding wire GND, and furthermore, the gate may be connected with the differential input terminal A(2).

The transistor TR28 may be, for example, a P-type transistor. Specifically, the transistor TR28 may control the ON/OFF thereof based on the clock CKA(2), and thereby, determine the electric potential of the differential output terminal Y(2). Further, in the transistor TR28, the drain may be connected with the source of the transistor TR29. Meanwhile, the source may be connected with the power line VDD, and furthermore, the gate may be connected with the differential input terminal A(2).

The transistor TR29 may be, for example, a P-type transistor. Specifically, the transistor TR29 may control the ON/OFF thereof based on the clock CKB(2), and thereby, determine the electric potential of the differential output terminal Y(2). Further, in the transistor TR29, the drain may be connected with the differential output terminal Y(2), the drains of the transistors TR26, TR27 and TR30, and the gate of the transistor TR25. Meanwhile, the source may be connected with the drain of the transistor TR28, and furthermore, the gate may be connected with the differential input terminal B(2).

The transistor TR30 may be, for example, an N-type transistor. Specifically, the transistor TR30 may control the ON/OFF thereof based on the clock CKB(2), and thereby, determine the electric potential of the differential output terminal Y(2). Further, in the transistor TR30, the drain may be connected with the differential output terminal Y(2), the drains of the transistors TR26, TR27 and TR29, and the gate of the transistor TR25. Meanwhile, the source may be connected with the grounding wire GND, and furthermore, the gate may be connected with the differential input terminal B(2).

Further, in the positive pulse generator 271, the transistor TR26 may be controlled based on the state of the differential output terminal Y(1), and the transistor TR25 may be controlled based on the state of the differential output terminal Y(2). By way of this, the current driving capability of the positive pulse generator 271 may be maximized when the states of the differential output terminals Y(1) and Y(2) are different from each other. Therefore, the positive pulse generator 271 may control the relation of the phases of the pulse signals PLS_C(1) and PLS_C(2), such that the relation of the phases of the signals becomes close to an opposite phase.

Figure 14:
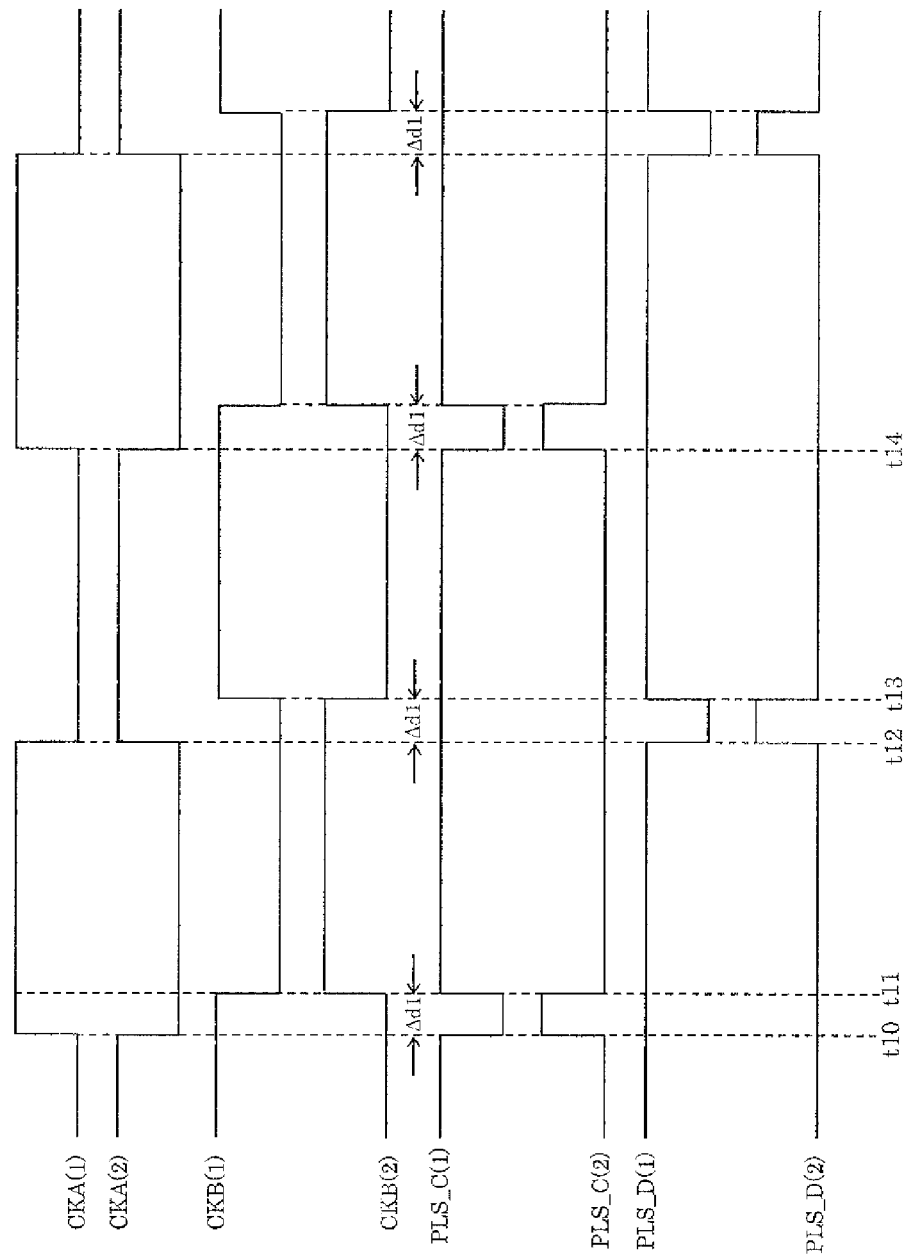
FIG. 14 is a timing chart of various control signals of a phase controller in a clock generator according to an embodiment of the present invention.

FIG. 14 is a timing chart of various control signals of a phase controller in a clock generator according to an embodiment of the present invention. More specifically, FIG. 14 is a timing chart showing the relation of the differential clocks CKA and CKB to be input to the pulse generator 27 and the differential pulse signals PLS_C and PLS_D to be output from the pulse generator 27, in the phase controller 20 of the clock generator 1 according to an embodiment of the present invention.

Referring to FIG. 14, assume that the frequency divider 23 and the delay circuit 26 input, to the pulse generator 27, the differential clock CKA alternating at a predetermined frequency and the differential clock CKB having a phase that is delayed by the delay time Δd1 relative to the differential clock CKA. In this case, the timings of the first rising and falling of the differential clock CKA are defined as a time t10 and a time t12, respectively. Further, the timings of the first rising and falling of the differential clock CKB are defined as a time t11 and a time t13, respectively.

During a time period from the time t10 to the time t11, the frequency divider 23 may set "1" as the state of the differential clock CKA, and output the differential clock. Further, the delay circuit 26 may set "1" as the state of the differential clock CKB, and output the differential clock. Then, based on the state "1" of the differential clock CKA output from the frequency divider 23 and the state "1" of the differential clock CKB output from the delay circuit 26, the pulse generator 27 may generate the differential pulse signals PLS_C and PLS_D having states of "0" and "1" respectively, and output the signals to the selection circuit 28.

During a time period from the time t11 to the time t12, the frequency divider 23 may set "1." as the state of the differential clock CKA, and output the differential clock. Further, the delay circuit 26 may set "0" as the state of the differential clock CKB, and output the differential clock. Then, based on the state "1" of the differential clock CKA output from the frequency divider 23 and the state "0" of the differential clock CKB output from the delay circuit 26, the pulse generator 27 may generate the differential pulse signals PLS_C and PLS_D having a state of "1", and output the signals to the selection circuit 28.

During a time period from the time t12 to the time t13, the frequency divider 23 may set "0" as the state of the differential clock CKA, and output the differential clock. Further, the delay circuit 26 may set "0" as the state of the differential clock CKB, and output the differential clock. Then, based on the state "0" of the differential clock CKA output from the frequency divider 23 and the state "0" of the differential clock CKB output from the delay circuit 26, the pulse generator 27 may generate the differential pulse signals PLS_C and PLS_D having states of "1" and "0" respectively, and output the signals to the selection circuit 28.

During a time period from the time t13 to the time t14, the frequency divider 23 may set "0" as the state of the differential clock CKA, and output the differential clock. Further, the delay circuit 26 may set "1" as the state of the differential clock CKB, and output the differential clock. Then, based on the state "0" of the differential clock CKA output from the frequency divider 23 and the state "1" of the differential clock CKB output from the delay circuit 26, the pulse generator 27 may generate the differential pulse signals PLS_C and PLS_D having a state of "1", and output the signals to the selection circuit 28.

As described above, the pulse generator 27 may generate the differential pulse signal PLS_C having a state of "0", during the time period after the timing of the rising of the differential clock CKA and before the timing of the falling of the differential clock CKB (i.e., Δd1 [s]), and generate the differential pulse signal PLS_C having a state of "1", during the other time period, to output the signal to the selection circuit 28. Further, the pulse generator 27 may generate the differential pulse signal PLS_D having a state of "0", during the time period after the timing of the falling of the differential clock CKA and before the timing of the rising of the differential clock CKB (i.e., Δd1 [s]), and generate the differential pulse signal PLS_D having a state of "1", during the other time period, to output the signal to the selection circuit 28. Therefore, the relation between the differential pulse signals PLS_C and PLS_D to be generated by the pulse generator 27 may has a relationship in which the phase of the differential pulse signal PLS_D may be delayed by 90° relative to the phase of the differential pulse signal PLS_C.

Figure 15:
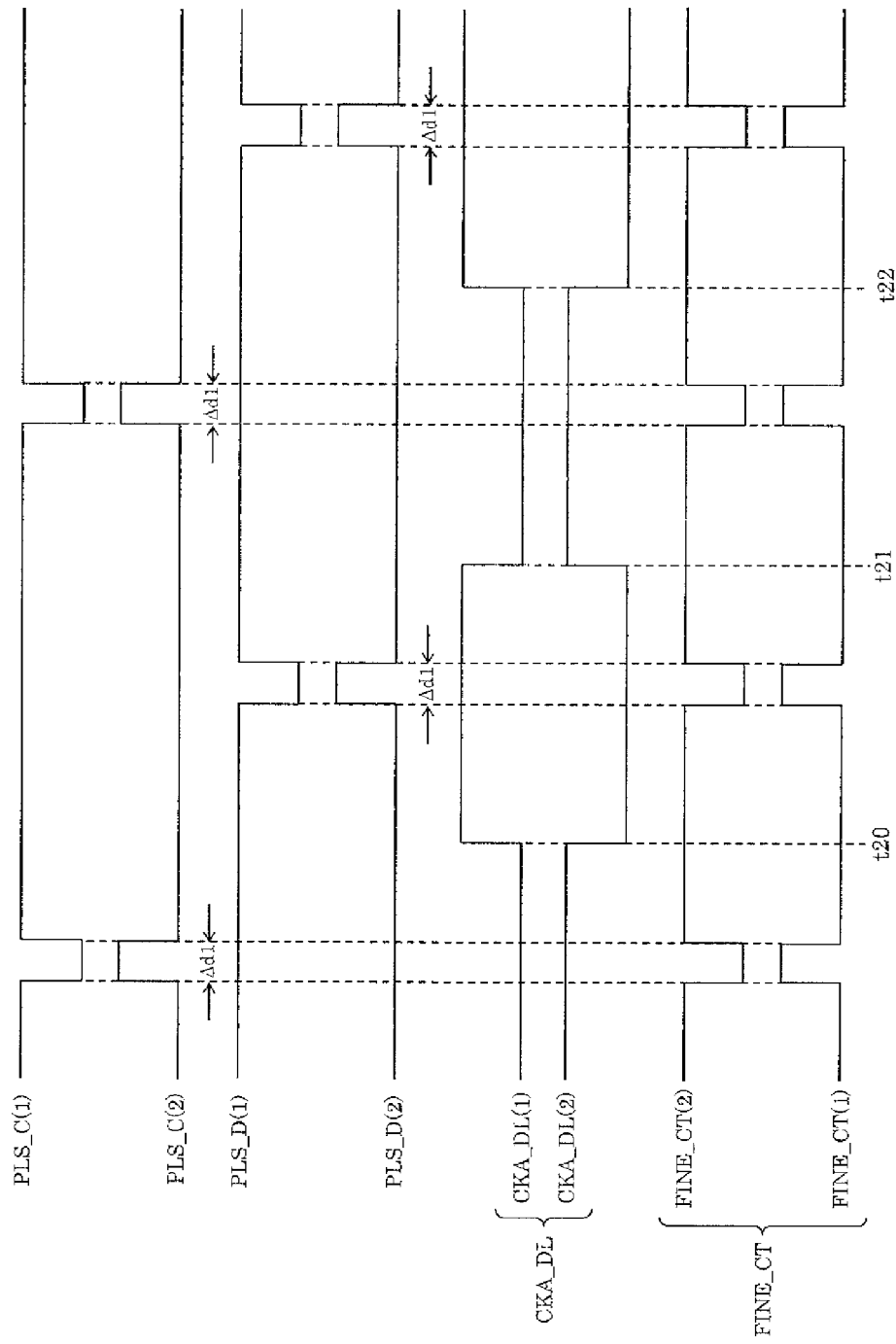
FIG. 15 is a timing chart of various control signals of a phase controller in a clock generator according to an embodiment of the present invention.

FIG. 15 is a timing chart of various control signals of a phase controller in a clock generator according to an embodiment of the present invention. More specifically, FIG. 15 is a timing chart showing the relation of the differential pulse signals PLS_C and PLS_D and the delay differential clock CKA_DL to be input to the selection circuit 28, and the fine phase control signal FINE_CT to be output from the selection circuit 28, in the phase controller 20 of the clock generator 1 according to an embodiment of the present invention.

In this disclosure, the positive and negative clocks of the delay differential clock CKA_DL are defined as delay clocks CKA_DL(1) and CKA_DL(2), respectively. Further, the positive and negative signals of the fine phase control signal FINE_CT are defined as fine phase control signals FINE_CT(1) and FINE_CT(2), respectively.

Referring to FIG. 15, assume that the pulse generator 27 inputs, to the selection circuit 28, the differential pulse signal PLS_C having pulses to be generated at predetermined intervals and the differential pulse signal PLS_D having a 90°-delayed phase relative to the differential pulse signal PLS_C, and the delay circuit 24 inputs, to the selection circuit 28, the delay differential clock CKA_DL alternating at twice the frequency of the differential pulse signals PLS_C and PLS_D. In this case, the timings of the first rising and falling of the delay differential clock CKA_DL are defined as a time t20 and a time t21, respectively. Further, the timing of the first rising of the delay differential clock CKA_DL after the time t21 may be defined as a time t22.

During a time period from the time t20 to the time t21, the delay circuit 24 may output the delay differential clock CKA_DL having a state of "1", to the selection terminal SL of the selection circuit 28. The pulse generator 27 may output the differential pulse signal PLS_C having a state of "1", to the input terminal A0 of the selection circuit 28, and output the differential pulse signal PLS_D having a pulse whose state changes from "1" to "0" and thereafter changes from "0" to "1" in the time period, to the input terminal A1 of the selection circuit 28. The selection circuit 28 may select the differential pulse signal PLS_D input to the input terminal A1, in accordance with the state "1" of the delay differential clock CKA_DL input to the selection terminal SL, and then output the selected signal from the output terminal Y to the voltage controlled oscillator 10, as the fine phase control signal FINE_CT.

During a time period from the time t21 to the time t22, the delay circuit 24 may output the delay differential clock CKA_DL having a state of "0", to the selection terminal SL of the selection circuit 28. The pulse generator 27 may output the differential pulse signal PLS_C having a pulse whose state changes from "1" to "0" and thereafter changes from "0" to "1" in the time period, to the input terminal A0 of the selection circuit 28, and may output the differential pulse signal PLS_D having a state of "1", to the input terminal A1 of the selection circuit 28. The selection circuit 28 may select the differential pulse signal PLS_C input to the input terminal A0, in accordance with the state "0" of the delay differential clock CKA_DL input to the selection terminal SL, and then output the selected signal from the output terminal Y to the voltage controlled oscillator 10, as the fine phase control signal FINE_CT.

Therefore, the selection circuit 28 may select the differential pulse signal PLS_C having a pulse being in a state changes from "1" to "0" and thereafter changes from "0" to "1", in a case where the state of the delay differential clock CKA_DL is "0". In contrast, the selection circuit 28 may select the differential pulse signal PLS_D having a pulse being in a state changes from "1" to "0" and thereafter changes from "0" to "1", in a case where the state of the delay differential clock CKA_DL is "1". The selection circuit 28 may generate the fine phase control signal FINE_CT in which the pulse is generated in half the cycle of the delay differential clock CKA_DL, and then output the signal to the voltage controlled oscillator 10.

As described above, the pulse generator 27 and the selection circuit 28 may constitute a differential exclusive disjunction circuit. FIGS. 14 and 15 reveal that the state of the fine phase control signal FINE_CT is the exclusive disjunction of the differential clocks CKA and CKB.

Figure 16:
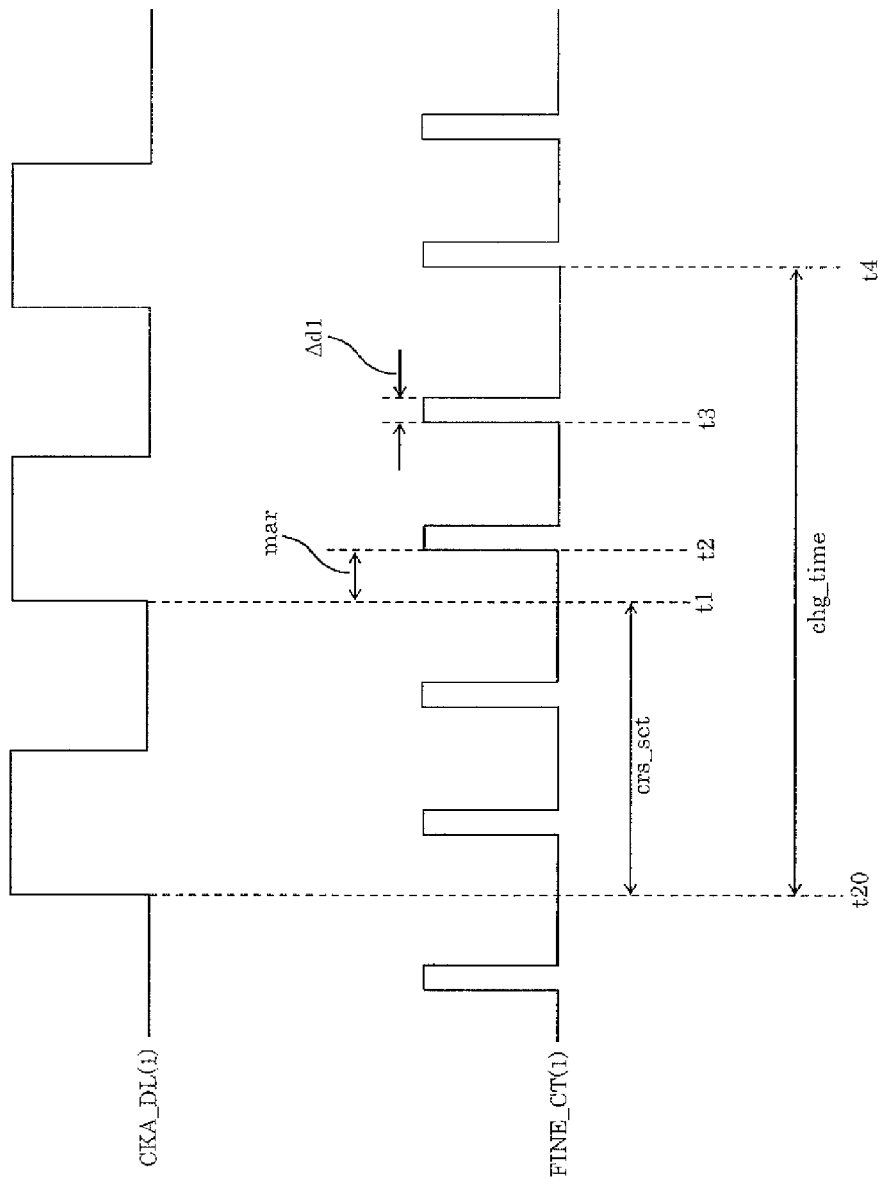
FIG. 16 is a timing chart of various control signals of a phase controller in a clock generator according to an embodiment of the present invention.

FIG. 16 is a timing chart of various signals of a phase controller in a clock generator according to an embodiment of the present invention. Specifically, FIG. 16 is a timing chart of various signals of the phase controller 20 in the clock generator 1 for estimating the time required for the regulation of the phases of the differential clocks CLKP and CLKN by the clock generator 1 according to an embodiment of the present invention.

In FIG. 16, the times t1 to t4 and the time t20 are the same as FIG. 7 and FIG. 15, respectively, and therefore the explanation will be omitted. Further, in FIG. 16, the time necessary for the phase controller 20 to change the state of the coarse phase control signal CRS_CT is defined as a time crs_set. Further, a time period after the state of the coarse phase control signal CRS_CT is changed and before the pulse is generated in the fine phase control signal FINE_CT is defined as a time period mar. Further, the time required for the phase controller 20 to regulate the phases of the differential clocks CLKP and CLKN to be output from the voltage controlled oscillator 10 is defined as a changing time chg_time. Further, in FIG. 16, assume that the frequency of the differential clock CLK (see FIG. 9) is 1.25 [GHz].

As described above, the delay differential clock CKA_DL may be generated by the giving of a delay to the differential clock CLK by the differential delay controller 22, the frequency division into one-half by the frequency divider 23, and furthermore, the giving of a delay by the delay circuit 24. Therefore, the frequency of the delay differential clock CKA_DL may be 625 [MHz], which is half the frequency of the differential clock CLK, and the cycle of the delay differential clock CKA_DL may be 1.6 [ns].

The output controller 25, based on the delay differential clock CKA_DL, may output the coarse phase setting signal CRS_ST to the voltage controlled oscillator 10, as the coarse phase control signal CRS_CT, and therefore, the time crs_set necessary to change the state of the coarse phase control signal CRS_CT may be 1.6 [ns], which is the cycle of the delay differential clock CKA_DL.

The selection circuit 28 may output the fine phase control signal FINE_CT with a pulse waveform, in half the cycle of the delay differential clock CKA_DL, and therefore, the cycle of the fine phase control signal FINE_CT may be 800 [ps]. Further, the fine phase control signal FINE_CT may have a phase that is delayed by at most 90° relative to the delay differential clock CKA_DL, and therefore, the length of the time period mar may be at most 400 [ps].

As described above, the voltage controlled oscillator 10 may regulate the phases of the differential clocks CLKP and CLKN, at the timing when the pulse is generated in the fine phase control signal FINE_CT. Further, the voltage controlled oscillator 10 can regulate the phases of the differential clocks CLKP and CLKN to intended phases, by at most two regulations of the differential clocks CLKP and CLKN (see FIG. 7).

Assume that three clocks are required for the regulation of the phases of the differential clocks CLKP and CLKN by the voltage controlled oscillator 10, in consideration of a margin. In this case, the time necessary for the regulation of the phases of the differential clocks CLKP and CLKN may be (the time crs_set)+(the time period mar)+(a time period in which three pulses are generated in the fine phase control signal FINE_CT), and therefore, may be 1.6 [ns]+400 [ps]+1.6 [ns]=3.6 [ns]. Accordingly, the clock generator 1 can complete the regulation of the phases of the differential clocks CLKP and CLKN, in at most 3.6 [ns] after the start of the regulation of the phases thereof.

Figure 17:
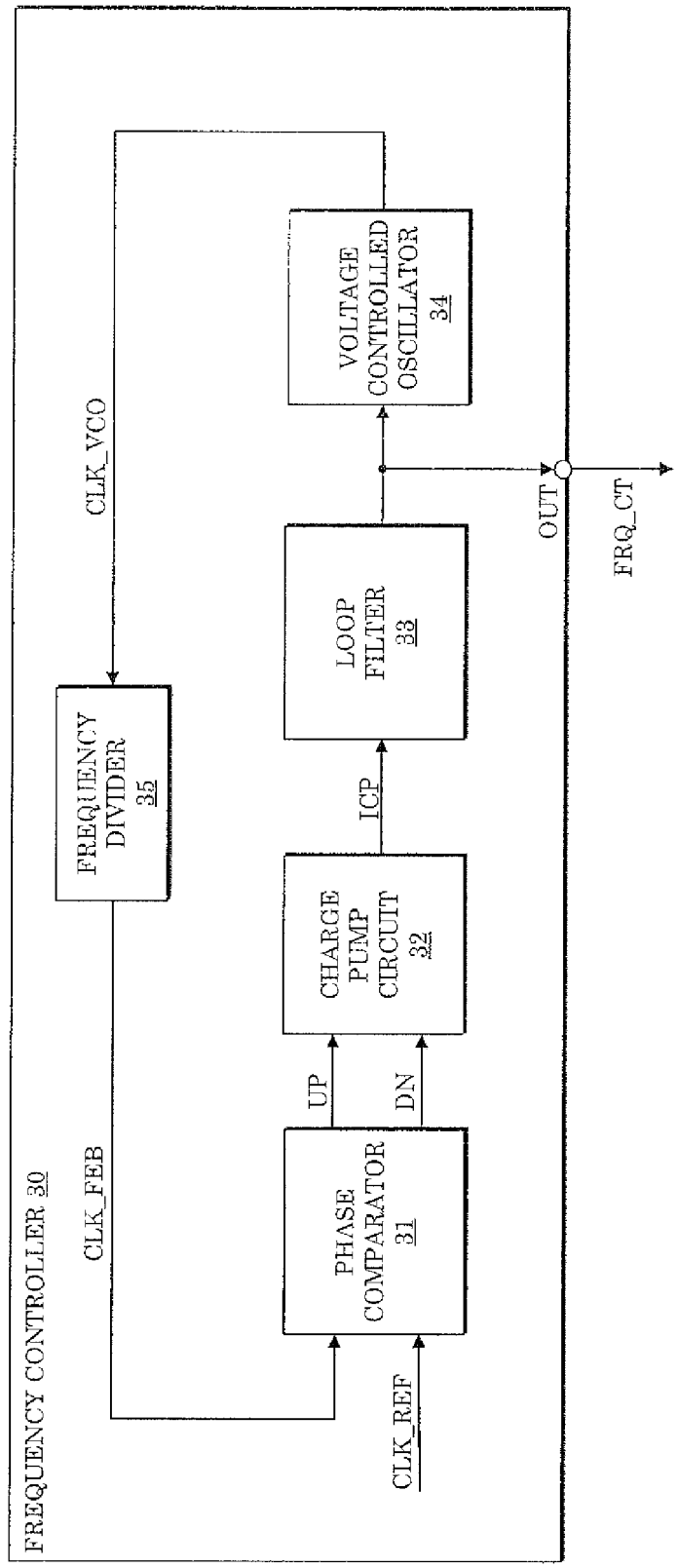
FIG. 17 is a block diagram showing an example of a frequency controller in a clock generator according to an embodiment of the present invention.

FIG. 17 is a block diagram showing an example of a frequency controller in a clock generator according to an embodiment of the present invention. As shown in FIG. 17, the frequency controller 30 may be configured to include, for example, a phase comparator 31, a charge pump circuit 32, a loop filter 33, a voltage controlled oscillator 34, and a frequency divider 35.

The phase comparator 31 may compare phases of a reference clock CLK_REF supplied from the exterior and a feedback clock CLK_FEB supplied from the frequency divider 35, and depending on the comparison result, output the phase difference between the clocks, to the charge pump circuit 32, as a pair of phase error signals UP and DN.

The charge pump circuit 32 may convert the phase error signals UP and DN output from the phase comparator 31, into a signal current, and output the signal current to the loop filter 33, as the drive signal ICP.

The loop filter 33 may receive the drive signal ICP output from the charge pump circuit 32, perform smoothing for the signal to convert it into a signal electric potential, and then output the signal converted into the signal electric potential, as the frequency control signal FRQ_CT, to the voltage controlled oscillator 34 and the frequency terminal FRQ of the voltage controlled oscillator 10 through an output terminal OUT.

The voltage controlled oscillator 34 may receive the frequency control signal FRQ_CT output from the loop filter 33, generate a clock CLK_VCO by oscillating at a frequency corresponding to the electric potential of the signal, and then output the signal to the frequency divider 35. It is noted that the voltage controlled oscillator 34, for oscillating the voltage controlled oscillator 10 at the same frequency as its own frequency, may have the same circuit configuration, circuit topology and/or circuit layout as the voltage controlled oscillator 10. In this case, a fine terminal FINE and a coarse terminal CRS of the voltage controlled oscillator 34 may be fixed in predetermined states respectively, and the voltage controlled oscillator 34 may receive, through a frequency terminal FRQ, the frequency control signal FRQ_CT output from the loop filter 33, and output the clock CLK_VCO from clock terminals CP and CN to the frequency divider 35.

The frequency divider 35 may receive the clock CLK_VCO output from the voltage controlled oscillator 34, generate the feedback clock CLK_FEB by performing the frequency division of the clock CLK_VCO in accordance with a predetermined division ratio, and output the generated feedback clock CLK_FEB to the phase comparator 31.

Figure 18:
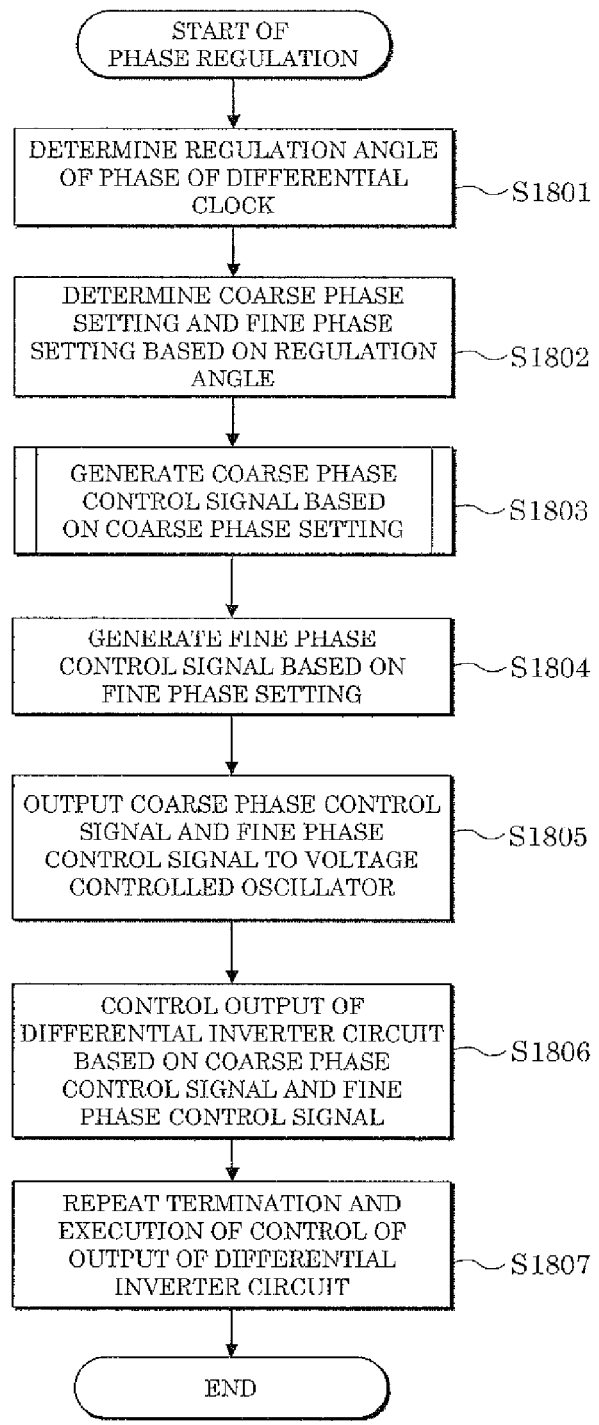
FIG. 18 is a flowchart for schematically explaining operation of a phase controller in a clock generator according to an embodiment of the present invention.

FIG. 18 is a flowchart for schematically explaining operation of a phase controller in a clock generator according to an embodiment of the present invention. Referring to FIG. 18, for example, based on a phase setting request from the exterior, the phase controller 20 may determine the regulation angle of the phases of the differential clocks CLKP and CLKN to be output by the voltage controlled oscillator 10 in accordance with the phase setting request (S1801).

Next, the phase controller 20 may determine the coarse phase setting and the fine phase setting, based on the regulation angle of the differential clocks CLKP and CLKN determined in the process of step S1801 (S1802). The coarse phase setting and the fine phase setting may be determined based on the coarse phase and the fine phase, respectively. The coarse phase, which may be a phase to be regulated by the coarse phase control signal CRS_CT, may be calculated by the following Formula 1. Further, the fine phase, which may be a phase to be regulated by the fine phase control signal FINE_CT, may be calculated by the subtraction of the coarse phase from the regulation angle.

(Coarse Phase)=180×ROUNDUP((Regulation Angle)/180)  <Formula 1> where ROUNDUP( ) in Formula 1 means the operation of rounding up the value in the parenthesis to the nearest whole number.

The phase controller 20 may generate the coarse phase control signal CRS_CT, based on the coarse phase determined in the process of step S1802 (S1803). The detail of the process of step S1803 will be explained with reference to FIG. 19. Next, the phase controller 20 may generate the fine phase control signal FINE_CT, based on the fine phase determined in the process of step S1802. Specifically, the phase controller 20 may generate the fine phase setting signal FINE_CT in the phase setter 21, such that the delay time of the differential delay controller 22 (see FIGS. 9 and 10) may be a delay time corresponding to the fine phase calculated in the process of step S1802, and by outputting the signal to the differential delay controller 22, generate the fine phase control signal FINE_CT (S1804).

The phase controller 20 may thus output the coarse phase control signal CRS_CT and fine phase control signal FINE_CT generated in the processes of steps S1803 and S1804, to the voltage controlled oscillator 10 (S1805). Based on the fine phase control signal FINE_CT, the phase controller 20 may perform, for the output of each differential inverter circuit 12, a control in accordance with the corresponding coarse phase control signal CRS_CT (S1806). Then, the phase controller 20 may regulate the phases of the differential clocks CLKP and CLKN to be output by the voltage controlled oscillator 10, by continuously reiterating (repeating) the termination of the control of the output of each differential inverter circuit 12 by the fine phase control signal FINE_CT and the coarse phase control signal CRS_CT and the re-execution of the control (S1807), and complete the regulation of the phase.

Figure 19:
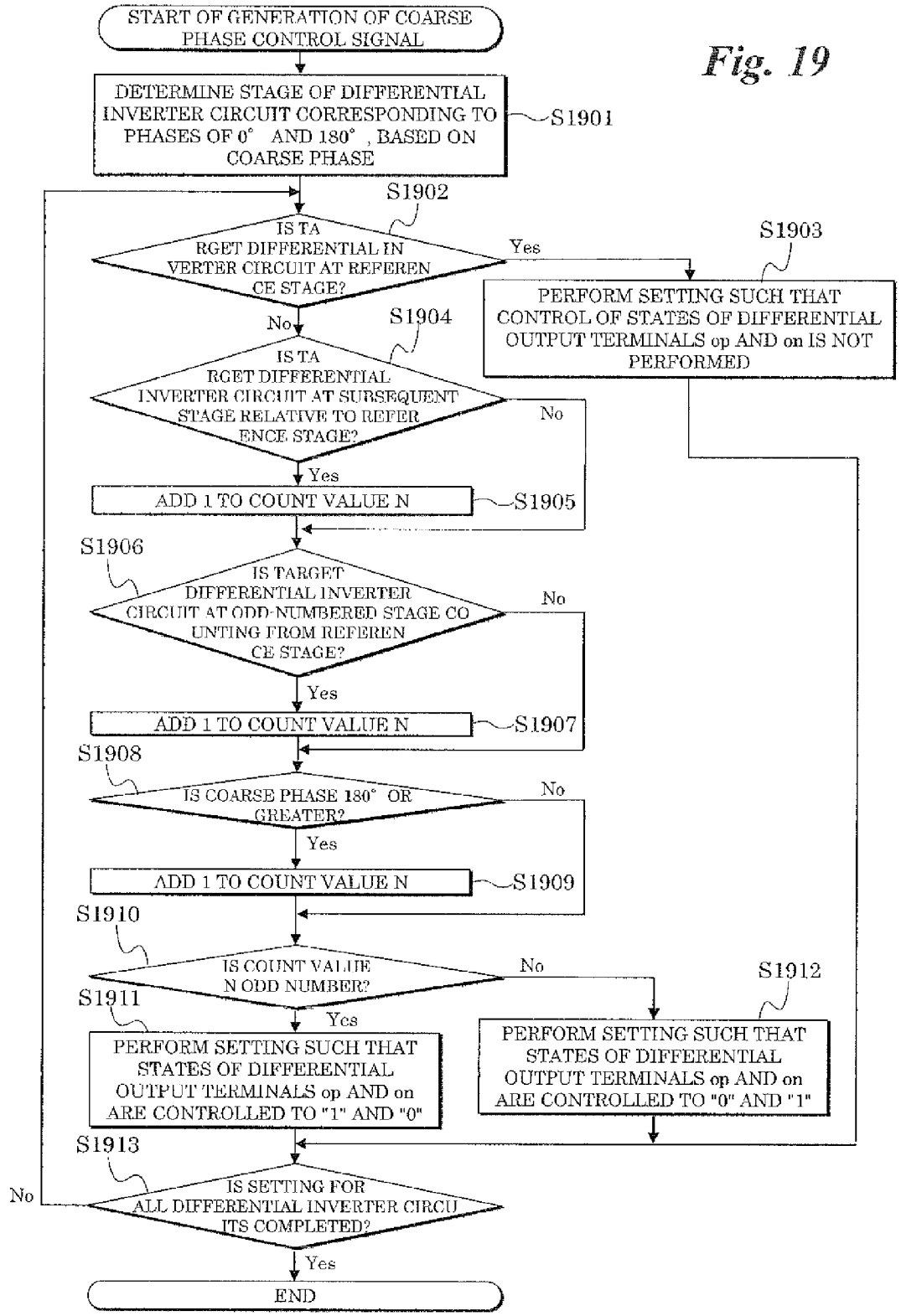
FIG. 19 is a flowchart for schematically explaining operation of a phase controller in a clock generator according to an embodiment of the present invention.

FIG. 19 is a flowchart for schematically explaining operation of a phase controller in a clock generator according to an embodiment of the present invention, and shows the detail of the process of step S1803 in FIG. 18.

First, the phase controller 20 may determine the stage of a differential inverter circuit 12 in which the phases of the differential clocks to be output are 0° and 180° (i.e., the reference stage), based on the coarse phase determined in the process of step S1802 (S1901). Suppose that the stage of the differential inverter circuit 12 at the foremost stage in the ring oscillator is 1 and the stage of the differential inverter circuit 12 increases in the propagation direction of the differential clocks (see FIG. 1). The reference stage may be calculated, for example, by the following Formula 2.

$$(\text{Reference Stage}) = \text{MOD}((\text{Coarse Phase}) \times (M/180) - 1, M) + 1 \qquad <\text{Formula 2}>$$

where MOD(x, y) in Formula 2 means the operation of deriving the remainder when a value x is divided by a value y. Further, a value M represents the number of the differential inverter circuits 12 in the voltage controlled oscillator 10.

Next, the phase controller 20 may initialize a count value N, and start the setting of the coarse phase for each differential inverter circuit 12. Specifically, the phase controller 20 may judge whether a setting-target differential inverter circuit 12 is at the reference stage (S1902). In a case of judging that the setting-target differential inverter circuit 12 is at the reference stage (Yes in S1902), the phase controller 20 may set the "non-control" as the state of the corresponding bit or signal of the coarse phase setting signal CRS_ST, such that the control of the output of the setting-target differential inverter circuit 12 may not be performed (S1903), and proceed to the process of step S1913.

On the other hand, in a case of judging that the setting-target differential inverter circuit 12 is not at the reference stage (No in S1902), the phase controller 20 may judge whether the setting-target differential inverter circuit 12 is at a subsequent stage relative to the reference stage (S1904). In a case of judging that the setting-target differential inverter circuit 12 is at a subsequent stage relative to the reference stage (Yes in S1904), the phase controller 20 may add 1 to the count value N (S1905), and proceed to the process of step S1906. On the other hand, in a case of judging that the setting-target differential inverter circuit 12 is not at a subsequent stage relative to the reference stage (No in S1904), the phase controller 20 may proceed to the process of step S1906.

The phase controller 20 may judge whether the setting-target differential inverter circuit 12 is at an odd-numbered stage counting from the reference stage (S1906). In a case of judging that the setting-target differential inverter circuit 12 is an odd-numbered stage counting from the reference stage (Yes in S1906), the phase controller 20 may add 1 to the count value N (S1907), and proceed to the process of step S1908. On the other hand, in a case of judging that the setting-target differential inverter circuit 12 is not at an odd-numbered stage counting from the reference stage (No in S1906), the phase controller 20 may proceed to the process of step S1908.

The phase controller 20 may judge whether the coarse phase is greater than or equal to 180° (S1908). In a case of judging that the coarse phase is greater than or equal to 180° (Yes in S1908), the phase controller 20 may add 1 to the count value N (S1909), and proceed to the process of step S1910. On the other hand, in a case of judging that the coarse phase is not greater than 180° (No in S1908), the phase controller 20 may proceed to the process of step S1910.

The phase controller 20 may judge whether the count value N is an odd number (S1910). In a case of judging that the count value N is an odd number (Yes in S1910), the phase controller 20 may set the "positive logic control" as the state of the corresponding bit or signal of the coarse phase setting signal CRS_ST, such that the states of the differential output terminals op and on of the target differential inverter circuit 12 are controlled to "1" and "0", respectively (S1911), and then proceed to the process of the step S1913. On the other hand, in a case of judging that the count value N is not an add number (No in S1910), the phase controller 20 may set the "negative logic control" as the state of the corresponding bit or signal of the coarse phase setting signal CRS_ST, such that the states of the differential output terminals op and on of the target differential inverter circuit 12 are controlled to "0" and "1", respectively (S1912), and then proceed to the process of the step S1913.

The phase controller 20 may judge whether the setting of the output control for all differential inverter circuits 12 is completed (S1913). In a case of judging that the setting of the output control for all differential inverter circuits 12 is not completed (No in S1913), the phase controller 20 may proceed to the process of step S1902. On the other hand, in a case of judging that the setting of the output control for all differential inverter circuits 12 is completed (Yes in S1913), the phase controller 20 may complete the process of the generation of the coarse phase control signal CRS_CT.

As described above, since a multiplexer is not connected with the output of each differential inverter circuit 12 of the ring oscillator, the clock generator 1 according to this embodiment can operate with a low electric power consumption, and furthermore, can regulate the phases of the differential clocks CLKP and CLKN while reducing the influence of a multiplexer on the oscillation frequency of the voltage controlled oscillator 10. Further, the clock generator 1 according to this embodiment may control the output of each differential inverter circuit 12 in accordance with the coarse phase control signal CRS_CT, at the timing when a pulse waveform is generated in the fine phase control signal FINE_CT, which is arbitrarily controllable, and thereby, can regulate the phases of the differential clocks CLKP and CLKN with a high accuracy.

The above embodiments are examples for describing the present invention, and it is not intended that the present invention is limited only to the embodiments. The present invention can be implemented in a variety of modes, without departing from the spirit thereof.

For example, in the method disclosed in the specification, the steps, operations or functions may be implemented in parallel or in different orders, as long as there is no inconsistency in the result. The described steps, operations and functions have been provided as just examples. In the scope without departing from the spirit of the present invention, some of the steps, operations and functions can be omitted or combined with each other into one, and other steps, operations or functions may be added.

Further, in the specification, which has disclosed a variety of embodiments, a particular feature (technical matter) in an embodiment can be appropriately improved, and therewith, can be added to an alternative embodiment or can replace the particular feature in the alternative embodiment. These modes also fall within the spirit of the present invention.

The present invention can be widely used in the field of semiconductor integrated circuits.

What is claimed is:

1. A clock generator comprising:
    a voltage controlled oscillator including a ring oscillator that has a plurality of differential inverter circuits connected in a ring shape; and
    a phase controller configured to provide each of the plurality of differential inverter circuits with phase control signals to control an output of at least one differential inverter circuit which belongs to a second group other than at least one differential inverter circuit which belongs to a first group in the plurality of differential inverter circuits, in a first state or a second state, for a predetermined time period, wherein the at least one differential inverter circuit which belongs to the second group, in the first state depending on the phase control signals, outputs a first logic signal from a first differential output terminal and outputs a second logic signal from a second differential output terminal, and wherein the at least one differential inverter circuit which belongs to the second group, in the second state depending on the phase control signals, outputs the second logic signal from the first differential output terminal and outputs the first logic signal from the second differential output terminal.

2. The clock generator according to claim 1, wherein the phase controller controls an output of the differential inverter circuit which belongs to the first group, to a third state depending on the phase control signals, for the predetermined time period, and wherein the differential inverter circuit which belongs to the first group, in the third state, performs logical negation for an output of a differential inverter circuit connected at the previous stage, and outputs a result of the logical negation to a differential inverter circuit at the next stage.

3. The clock generator according to claim 1, wherein each of the plurality of differential inverter circuits further comprises:
  a first inverter circuit configured to perform logical negation for one of differential clocks and to output the result of the logical negation from the second differential output terminal, the one of the differential clocks being input to a first differential input terminal; and
  a second inverter circuit configured to perform logical negation for the other of the differential clocks and to output the result of the logical negation from the first differential output terminal, the other of the differential clocks being input to a second differential input terminal.

4. The clock generator according to claim 2, wherein each of the plurality of differential inverter circuits further comprises:
  a first current path to be connected between the first differential output terminal and a first power line; and
  a second current path to be connected between the second differential output terminal and the first power line,
  wherein the first current path and the second current path are electrically connected, respectively, when the corresponding differential output terminal outputs the first logic signal.

5. The clock generator according to claim 2, wherein each of the plurality of differential inverter circuits further comprises:
  a first current path to be connected between the first differential output terminal and
  a second power line; and a second current path to be connected between the second differential output terminal and the second power line, and
  the first current path and the second current path are electrically connected, respectively, when the corresponding differential output terminal outputs the second logic signal.

6. The clock generator according to claim 1, wherein the phase controller controls the output of the differential inverter circuit which belongs to the second group, in the first state or the second state, for the predetermined time period, in a predetermined cycle proportional to a cycle of a first differential clock that is output by the voltage controlled oscillator.

7. The clock generator according to claim 1, wherein the phase controller outputs a coarse phase control signal and a fine phase control signal to the voltage controlled oscillator, the coarse phase control signal having a correspondence relationship of each of the plurality of differential inverter circuits to the first state and the second state, the fine phase control signal having a pulse waveform having a predetermined pulse width, and at a rising or a falling of the pulse waveform of the fine phase control signal, the voltage controlled oscillator determines each output of the plurality of differential inverter circuits as the first state or the second state in accordance with the correspondence relationship, for the predetermined time period corresponding to the predetermined pulse width of the fine phase control signal.

8. The clock generator according to claim 7, wherein the phase controller comprises:
  a phase setter configured to determine a fine phase setting based on a regulation angle that is requested externally, the fine phase setting being relevant to a phase difference of a differential clock that is output by each of the plurality of differential inverter circuits, the regulation angle being a regulation angle for a phase of a first differential clock that is output by the voltage controlled oscillator;
  a differential delay controller configured to provide a first delay time in accordance with the fine phase setting to a second differential clock, and to output the second differential clock as a third differential clock;
  a delay circuit configured to provide a second delay time corresponding to the pulse width to the third differential clock, and to output the third differential lock as a fourth differential clock; and
  a logic circuit configured to generate the fine phase control signal in accordance with the third differential clock and the fourth differential clock, and to output the fine phase control signal to the voltage controlled oscillator.

9. The clock generator according to claim 8, wherein the phase setter determines a coarse phase setting based on the regulation angle, the coarse phase setting indicating a greater phase difference than the phase difference which the fine phase setting indicates, and wherein the phase controller, synchronously with the fine phase control signal, outputs the coarse phase setting to the voltage controlled oscillator, as the coarse phase control signal.

10. The clock generator according to claim 8, wherein the logic circuit performs exclusive disjunction for the third differential clock and the fourth differential clock, and outputs a result of the exclusive disjunction to the voltage controlled oscillator, as the fine phase control signal.

11. The clock generator according to claim 9, wherein the phase setter:
  determines the at least one differential inverter circuit as the first group which corresponds to the regulation angle from among the plurality of differential inverter circuits,
  determines the at least one differential inverter circuit as the second group other than the at least one differential inverter circuit which belongs to the first group from among the plurality of differential inverter circuits, determines the output of the at least one differential inverter circuit which belongs to the second group, as the first state or the second state, and sets the determined state of the outputs of the plurality of differential inverter circuits, as the coarse phase setting.

12. The clock generator according to claim 11, wherein the phase setter sets a predetermined count value to an initial value, the phase setter judges whether the regulation angle is greater than or equal to 180°, and increments the predetermined count value in a case of judging that the regulation angle is greater than or equal to 180°, the phase setter judges whether, in the ring oscillator, a specific differential inverter circuit which belongs to the second group is at a subsequent stage relative to the differential inverter circuit which belongs to the first group, and increments the predetermined count value in a case of judging that, in the ring oscillator, the specific differential inverter circuit is at a subsequent stage relative to the differential inverter circuit belonging to the first group, the phase setter judges whether, in the ring oscillator, the specific differential inverter circuit is at an odd-numbered stage counting from the differential inverter circuit belonging to the first group, and increments the predetermined count value in a case of judging that, in the ring oscillator, the single differential inverter circuit is at an odd-numbered stage counting from the differential inverter circuit corresponding to the first group, and the phase setter judges whether the predetermined count value is an odd number, determines an output of the single differential inverter circuit as the first state in a case of judging that the predetermined count value is an odd number, and determines the output of the single differential inverter circuit as the second state in a case of judging that the predetermined count value is not an odd number.

13. The clock generator according to claim 1, further comprising a frequency controller corresponding to operation of the voltage controlled oscillator to control an oscillation frequency of the ring oscillator.

14. A regulation method for a phase of a differential clock that is output by a voltage controlled oscillator including a ring oscillator which has a plurality of differential inverter circuits operably connected in a ring shape, the method comprising:

generating phase control signals; and controlling, based on the phase control signals provided to each of the plurality of differential inverter circuits, an output of at least one differential inverter circuit which belongs to a second group other than at least one differential inverter circuit which belongs to a first group in the plurality of differential inverter circuits, in a first state or a second state, for a predetermined time period, wherein the at least one differential inverter circuit which belongs to the second group, in the first state depending on the phase control signals, outputs a first logic signal from a first differential output terminal and outputs a second logic signal from a second differential output terminal, and wherein the at least one differential inverter circuit which belongs to the second group, in the second state depending on the phase control signals, outputs the second logic signal from the first differential output terminal and outputs the first logic signal from the second differential output terminal.

15. The regulation method according to claim 14, further comprising:

controlling an output of the differential inverter circuit which belongs to the first group, into a third state depending on the phase control signals, for the predetermined time period, and performing, in the differential inverter circuit which belongs to the first group, in the third state, logical negation for an output of a differential inverter circuit connected at the previous stage, and outputting a result of the logical negation to a differential inverter circuit at the next stage.

16. The regulation method according to claim 14, further comprising:

performing, in each of the plurality of differential inverter circuits, logical negation for one of differential clocks and outputting the result of the logical negation from the second differential output terminal, the one of the differential clocks being input to a first differential input terminal thereof; and performing, in each of the plurality of differential inverter circuits, logical negation for the other of the differential clocks and outputting the result of the logical negation from the first differential output terminal, the other of the differential clocks being input to a second differential input terminal thereof.

17. The regulation method according to claim 14, further comprising:

controlling the output of the differential inverter circuit which belongs to the second group, in the first state or the second state, for the predetermined time period, in a predetermined cycle proportional to a cycle of a first differential clock that is output by the voltage controlled oscillator.

18. The regulation method according to claim 14, further comprising outputting a coarse phase control signal and a fine phase control signal to the voltage controlled oscillator, the coarse phase control signal having a correspondence relationship of each of the plurality of differential inverter circuits to the first state and the second state, the fine phase control signal having a pulse waveform having a predetermined pulse width, and at a rising or a falling of the pulse waveform of the fine phase control signal, determining each output of the plurality of differential inverter circuits as the first state or the second state in accordance with the correspondence relationship, for the predetermined time period corresponding to a predetermined pulse width of the fine phase control signal.

19. The regulation method according to claim 18, further comprising determining a fine phase setting based on a regulation angle that is requested externally, the fine phase setting being relevant to a phase difference of a differential clock that is output by each of the plurality of differential inverter circuits, the regulation angle being a regulation angle for a phase of a first differential clock that is output by the voltage controlled oscillator;

providing a first delay time in accordance with the fine phase setting to a second differential clock, and outputting the second differential clock as a third differential clock;

providing a second delay time corresponding to the pulse width to the third differential clock, and outputting the third differential clock as a fourth differential clock; and generating the fine phase control signal in accordance with the third differential clock and the fourth differential clock, and outputting the fine phase control signal to the voltage controlled oscillator.

20. The regulation method according to claim 14, further comprising controlling an oscillation frequency of the ring oscillator to control an operation of the voltage controlled oscillator.

* * * * *